United States Patent [19]
Roohparvar

[11] Patent Number: 5,677,885
[45] Date of Patent: *Oct. 14, 1997

[54] MEMORY SYSTEM WITH NON-VOLATILE DATA STORAGE UNIT AND METHOD OF INITIALIZING SAME

[75] Inventor: Frankie F. Roohparvar, Cupertino, Calif.

[73] Assignee: Micron Quantum Devices, Inc., Santa Clara, Calif.

[*] Notice: The term of this patent shall not extend beyond the expiration date of Pat. No. 5,615,159.

[21] Appl. No.: 751,072

[22] Filed: Nov. 15, 1996

Related U.S. Application Data

[63] Continuation of Ser. No. 563,505, Nov. 28, 1995, Pat. No. 5,615,159.

[51] Int. Cl.⁶ .................................................. G11C 7/00
[52] U.S. Cl. .................... 365/201; 365/210; 371/21.1
[58] Field of Search ............................. 365/201, 210; 371/21.1, 21.4

[56] References Cited

U.S. PATENT DOCUMENTS

| | | | |
|---|---|---|---|
| 5,031,142 | 7/1991 | Castro | 365/49 |
| 5,047,664 | 9/1991 | Moyal | 307/303 |
| 5,371,712 | 12/1994 | Oguchi et al. | 365/201 |
| 5,457,696 | 10/1995 | Mori | 365/201 |
| 5,615,159 | 3/1997 | Roohparvar | 365/201 |

Primary Examiner—Son T. Dinh
Attorney, Agent, or Firm—Limbach & Limbach L.L.P.

[57] ABSTRACT

A memory system (preferably implemented as an integrated circuit) including an array of memory cells, a control unit for controlling operations of the system (such as programming, reading, and erasing the cells), at least one data storage unit which stores control parameter data determining at least one control parameter for the system, and default parameter circuitry for asserting at desired times one or both of: default control parameter data (regardless of the control parameter data stored in each data storage unit); and at least one default voltage level (in place of an otherwise asserted voltage level). In preferred embodiments, the default control parameter data (or voltage levels) are asserted during a test initialize mode in response to an initialization signal generated by the control unit, for use in initializing internal control registers (and voltage levels) of the system so that an external program for controlling the system during the test mode can start from a known condition. Other embodiments are methods for asserting default control parameter data of memory systems at desired times during system operation (regardless of the values of control parameter data stored in storage units of the system), methods for asserting default voltage values at desired times during operation of such systems, and memory systems capable of performing such methods.

14 Claims, 10 Drawing Sheets

MEMORY SYSTEM WITH NON-VOLATILE DATA STORAGE UNIT AND METHOD OF INITIALIZING SAME

This is a continuation of U.S. patent application Ser. No. 08/563,505, filed Nov. 28, 1995, now U.S. Pat. No. 5,615,159.

BACKGROUND OF THE INVENTION

1. Field of the Invention

The invention relates to memory systems in which programmable control parameters are stored in one or more non-volatile data storage units so that each system's parameters can be reprogrammed (by reprogramming each data storage unit) after the system has been fabricated, and to methods for operating such systems. More specifically, the invention relates to methods for asserting default values of control parameters of memory systems at desired times, regardless of the values of control parameters stored in non-volatile data storage units of the systems, and to memory systems capable of performing such methods.

2. Background Art

Integrated circuit memory systems have been developed having very large storage capacities. Although attempts have been made to control carefully the fabrication of these systems to increase yield, there invariably are differences in the characteristics of individual systems, even among systems having the same design. These differences in characteristics are attributable to many factors but are mostly due to processing variations. Thus, memory systems taken from one semiconductor wafer may differ significantly from those taken from other wafers.

It is usually not possible to characterize a memory system fully until it is completely fabricated. At that point, it is not possible to modify the memory system to take into account the characteristics of the memory. For example, in a flash memory system it is possible to electrically program, read, and erase the flash cells. The logic state of each cell is set by either programming or erasing the cell, with programming and erasing functioning to alter the threshold voltage of the cell. When the cell is read, the threshold voltage of the cell is determined in order to establish the logic state of the cell. However, the characteristics of the flash cell, such as the exact manner in which the flash cell responds to programming pulses or erase pulses, are not easily ascertained. The threshold voltage of the cell of one memory system may change one amount after a single programming pulse is applied and a cell of another supposedly identical memory system may change a different amount after the same programming pulse is applied to it.

In order to accommodate these variations in memory system characteristics, it is typically necessary to design the system assuming worst case conditions. If so, the overall performance of the system will almost necessarily be reduced.

Many processor systems which operate with an associated memory require a particular memory configuration to operate properly. For example, some systems require a word length of eight bits and others require sixteen bits. Some conventional memory systems permit the end user to control word size to some degree. However, this somewhat increases the complexity imposed on the end user since the end user must provide the necessary signals to the memory for controlling word length.

As another example, most processor systems look to a certain portion of a memory for boot data at power on. Such boot data is necessary for the processor to function, and the processor is implemented to expect the boot data to be at specific memory address. Some processors expect the boot data to be at the memory low addresses (bottom boot) and other processors expect the boot data to be at the memory high addresses (top boot).

In order to provide capabilities for different types of processor systems, it is possible to produce a different memory system for each application. However, it is always desirable to limit the number of different memory types which must be manufactured.

It would be desirable to have a memory system which can be fully characterized after fabrication and wherein operating parameters can then be permanently adjusted (or stably adjusted, until modified) to provide a memory system that is optimized to take into account the system's particular characteristics. It would also be desirable to provide capability for modifying the configuration (i.e., the operating parameters) of a memory system after fabrication so as to reduce the number of different types of memories which must be fabricated. Memory systems having these features are described in U.S. patent application Ser. No. 08/508,864 (filed Jul. 28, 1995), entitled "NON-VOLATILE DATA STORAGE UNIT AND METHOD OF CONTROLLING SAME", and U.S. patent application Ser. No. 08/508,921, entitled MEMORY SYSTEM HAVING PROGRAMMABLE FLOW CONTROL REGISTER, filed Jul. 28, 1995, the contents of each of which are incorporated herein by reference. Preferred embodiments of the present invention pertain to such memory systems.

It would also be desirable to design memory systems (including but not limited to integrated memory circuits) to have the capability to store (in a non-volatile manner) parameters relating to circuit operation. For example, sometimes an integrated memory circuit is designed for use in different operating modes. The circuit can be configured at a fabrication facility to operate permanently in only one mode, depending upon the requirements of a particular user. This can be achieved by modifying the metallization layer of the integrated circuit so that the desired operating mode is achieved. The latter approach has the advantage that the change in metallization is permanent and will not be affected by loss of operating power. However, this advantage is offset by many disadvantages, including the disadvantage that further changes in the stored operating parameters cannot be made once the metallization has been completed. This is particularly disadvantageous where the value of the stored parameters is dependent on the characteristics of the integrated circuit which frequently cannot be ascertained until the metallization has been completed. In addition, once the integrated circuit has been packaged, it is frequently impossible to ascertain the value of the stored parameter.

The present invention also pertains to memory systems capable of storing operating parameters in a non-volatile memory so that such stored parameters can be altered at any time after the fabrication process (e.g., the integrated memory circuits described in cited U.S. patent applications Ser. No. 08/508,864 and U.S. patent application Ser. No. 08/508,921). In such systems, once a parameter has been stored the parameter is retained even in the event of a loss of power.

In memory circuits having non-volatile storage units (each for storing at least one control parameter), it would be desirable to selectively assert default values of at least some of the control parameters at desired times (e.g., automatically upon initialization of a test mode of operation of the circuit in response to a "test mode initialization" signal), regardless of the control parameter data stored in the storage units at such times. The present invention provides such a capability, and permits initialization of internal control registers (and/or analog voltage levels) of an integrated circuit memory system (or other memory system), so that an external program for controlling operation of the system can start from a known condition.

SUMMARY OF THE INVENTION

In a preferred embodiment, the invention is an integrated memory circuit including an array of memory cells arranged in rows and columns, and a control means for controlling memory operations (e.g., programming, reading, and erasing the cells). Typically, the cells in each row are coupled to a common word line and the cells in each column are coupled to a common bit line. The circuit also includes at least one data storage unit programmed (after fabrication of the circuit) to store control parameter data determining at least one control parameter for the system. Such control parameter data can, for example, determine control parameters for adjusting the magnitude and duration of voltage pulses applied to the memory during programming and erasing operations, or parameters for controlling the length of words read out and programmed into the memory.

The circuit also includes a default parameter means for asserting at desired times one or both of: default control parameter data determining default values of at least a subset of the control parameters (regardless of the control parameter data stored in the data storage units); and at least one default voltage level (in place of an otherwise asserted voltage, e.g., an analog reference voltage). Typically, such default data (or default voltage levels) are asserted during a test mode of the circuit in response to a test mode initialization or control signal from the control means. In preferred embodiments, the default data (or default voltage levels) are asserted during a test initialize mode in response to a test mode initialization signal from the control means, to permit initialization of internal control registers (and analog voltage levels) of the memory system so that an external program for controlling test mode operation of the system can start from a known condition. In some such preferred embodiments, the default parameter means responds to the test mode initialization signal by asserting a default value of a control parameter (regardless of the content of data in a storage unit corresponding to the control parameter), and also by asserting a default analog voltage level (in place of a reference voltage otherwise asserted by the system).

More generally, other embodiments of the invention are methods for asserting default values of control parameters of memory systems at desired times during system operation such as during a test initialize mode (regardless of the values of control parameter data stored in storage units of the systems) or methods for asserting default voltage values (analog or digital values) at desired times during operation of such systems (such as during a test initialize mode), and memory systems capable of performing such methods.

DETAILED DESCRIPTION OF THE INVENTION

Many conventional memory chips operate in either a test mode in which input/output ("I/O") pads are connected directly to an array of memory cells, or a "normal" (or "active") mode in which the I/O pads are connected through buffer circuitry to the array of memory cells. In the latter ("normal") mode the chip can perform read/write operations in which data is written to selected ones of the cells through an input buffer (or data is read from selected ones of the cells through an output buffer).

Figure 1:
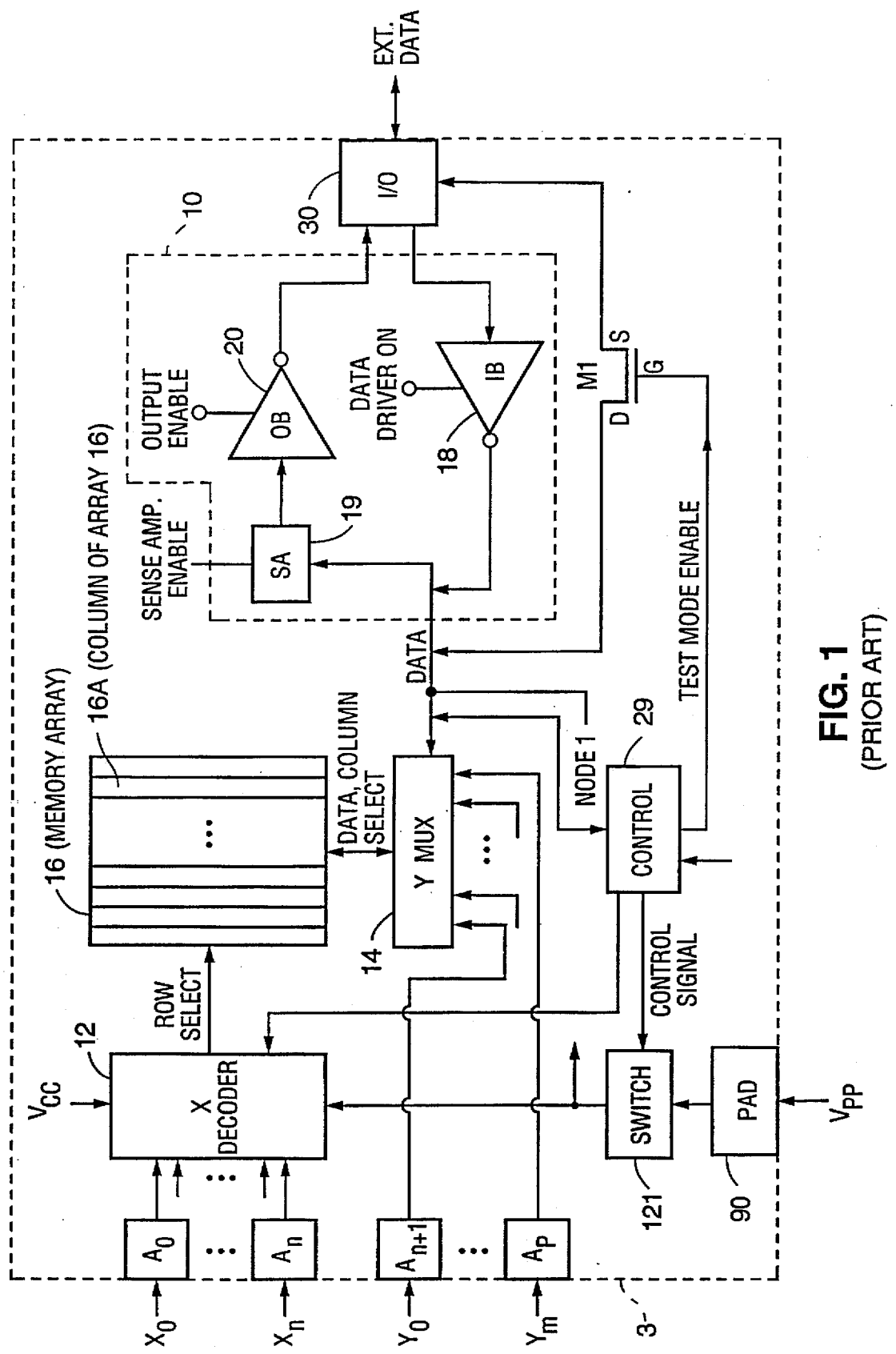
FIG. 1 is a block diagram of a memory system which can be modified to implement the present invention.

FIG. 1 is a simplified block diagram of a conventional memory chip (integrated circuit 3) capable of operating in a normal or test mode. Memory chip 3 of FIG. 1 includes at least one I/O pad 30 (for asserting output data to an external device or receiving input data from an external device), I/O buffer circuit 10 for I/O pad 30, test mode switch M1, address buffers A0 through Ap for receiving memory address bits from an external device, row decoder circuit (X address decoder) 12, column multiplexer circuit (Y multiplexer) 14, memory array 16 (comprising columns of nonvolatile memory cells, such as column 16A), pad 90, switch 121 connected between pad 90 and other components of chip 3, and control unit 29. Each of address buffers A0 through Ap includes an address bit pad for receiving (from an external device) a different one of address bit signals X0 through Xn and Y0 through Ym.

I/O buffer circuit 10 includes a "write" branch and a "read" branch. The write branch comprises input buffer 18. The read branch comprises sense amplifier 19 and output buffer 20.

In the normal operating mode of chip 3, control unit 29 can cause chip 3 to execute a write operation in which it receives data (to be written to memory array 16) from an external device at I/O pad 30, buffers the data in the write branch, and then writes the data to the appropriate memory cell. Also in this normal operating mode, control unit 29 can cause chip 3 to execute a read operation in which it amplifies and buffers data (that has been read from array 16) in the read branch, and then asserts this data to I/O pad 30.

Although only one I/O pad (pad 30) is shown in FIG. 1, typical implementations of the FIG. 1 circuit include a plurality of I/O pads, and each I/O pad is buffered by an I/O buffer circuit similar or identical to circuit 10. For example, one implementation of the FIG. 1 circuit includes eight I/O pads, eight buffer circuits identical to circuit 10, one line connected between the output of the output buffer 20 of each buffer circuit and one of the I/O pads (so that eight data bits can be read in parallel from buffers 20 to the pads), and one line connected between the input of the input buffer 18 of each buffer circuit and one of the I/O pads (so that eight data bits can be written in parallel from the pads to buffers 18). Each I/O pad (including I/O pad 30) typically has high impedance when the output buffer is not enabled.

Each of the cells (storage locations) of memory array circuit 16 is indexed by a row index (an "X" index determined by decoder circuit 12) and a column index (a "Y" index output determined by circuit 14). Each column of cells of memory array 16 (e.g., column 16A of FIG. 1) comprises "n" memory cells, each cell implemented by a floating-gate N-channel transistor. The drains of all transistors of a column are connected to a bitline, and the gate of each of the transistors is connected to a different wordline, and the sources of the transistors are held at a source potential (which is usually ground potential for the chip during a read or programming operation). Each memory cell is a nonvolatile memory cell since the transistor of each cell has a floating gate capable of semipermanent charge storage. The current drawn by each cell (i.e., by each of the N-channel transistors) depends on the amount of charge stored on the cell's floating gate. Thus, the charge stored on each floating gate determines a data value that is stored "semipermanently" in the corresponding cell. In cases in which each of the N-channel transistors is a flash memory device, the charge stored on the floating gate of each is erasable (and thus the data value stored by each cell is erasable) by appropriately changing the voltage applied to the gate and source (in a well known manner).

In response to address bits Y0–Ym, circuit 14 (of FIG. 1) determines a column address which selects one of the columns of memory cells of array 16 (connecting the bitline of the selected column to Node 1 of FIG. 1), and in response to address bits X0–Xn, decoder circuit 12 (of FIG. 1) determines a row address which selects one cell in the selected column.

The function of switch M1 in FIG. 1 is to switch chip 3 between its test mode and its normal operating mode. Conventionally, switch M1 is an NMOS transistor whose gate receives a control signal ("Test Mode Enable") from internal control logic within control unit 29. The source and drain of M1 are connected in series with I/O pad 30 and circuit 14. Switch M1 operates as follows in response to the control signal:

M1 is "on" when Test Mode Enable is high (when the value of Test Mode Enable triggers the "test" mode of FIG. 1), and thus M1 functions as a pass transistor which passes a signal (a "test" signal) indicative of test data to be written to or read from a selected cell of array 16 (e.g., a current signal indicative of test data read from the selected cell) between its source and drain (and thus between I/O pad 30 and the selected cell of array 16). If buffers 18 and 20 of circuit 10 are disabled when M1 is on, the test signals pass through M1 but not through circuit 10; and M1 is "off" when Test Mode Enable is low (when the value of Test Mode Enable triggers the "normal" operating mode of FIG. 1), so that signals (indicative of data to be written to memory array 16) provided from an external device to I/O pad 30 are buffered in input buffer 18 and then asserted to memory array 16, or signals (indicative of data read from memory array 16) are asserted from memory array 16 to sense amplifier 19, amplified in amplifier circuit 19, and then buffered in output buffer 20 and asserted to I/O pad 30. Typically, the "low" value of Test Mode Enable is ground potential.

In the normal operating mode of FIG. 1 (with M1 "off"), the FIG. 1 circuit executes a write operation as follows. Each of address buffers A0 through An asserts one of bits X0–Xn to decoder circuit 12, and each of address buffers An+1 through Ap asserts one of bits Y0–Ym to circuit 14. In response to these address bits, circuit 14 determines a column address (which selects one of the columns of memory cells of array 16, such as column 16A), and circuit 12 determines a row address (which selects one cell in the selected column). In response to a write command supplied from control unit 29, a signal (indicative of data) present at the output of input buffer 18 (which has been enabled by the appropriate level of the control signal "DATA DRIVER ON") is asserted through circuit 14 to the cell of array 16 determined by the row and column address (e.g., to the drain of such cell). During such write operation, output buffer 20 is disabled (in response to an appropriate level of control signal OUTPUT ENABLE).

A data latch (not shown in FIG. 1) is typically provided between input buffer 18 and I/O pad 30 for storing data (to be written to a memory cell) received from I/O pad 30. When the latched data is sent to input buffer 18, input buffer 18 produces a voltage at Node 1 which is applied to the selected memory cell. Input buffer 18 is typically implemented as a tri-statable driver having an output which can be placed in a high impedance mode (and thus disabled) during a read operation. Input buffer 18 is disabled by asserting (to input buffer 18) an appropriate level of the control signal DATA DRIVER ON. In some implementations, the functions of the latch and input buffer 18 are combined into a single device.

In the normal operating mode (with M1 "off"), the FIG. 1 circuit executes a read operation as follows. Each of address buffers A0 through An asserts one of bits X0–Xn to address decoder circuit 12, and each of address buffers An+1 through Ap asserts one of bits Y0–Ym to circuit 14. In response to these address bits, circuit 14 asserts a column address to memory array 16 (which selects one of the columns of memory cells, such as column 16A), and circuit 12 asserts a row address to memory array 16 (which selects one cell in the selected column). In response to a read command supplied from control unit 29, a current signal indicative of a data value stored in the cell of array 16 (a "data signal") determined by the row and column address is supplied from the drain of the selected cell through the bitline of the selected cell and then through circuit 14 to sense amplifier 19. This data signal is amplified in amplifier 19, buffered in output buffer 20 (which is enabled by an appropriate level of control signal "OUTPUT ENABLE"), and finally asserted at I/O pad 30. During such read operation, input buffer 18 is disabled (in response to an appropriate level of control signal DATA DRIVER ON).

Chip 3 of FIG. 1 also includes a pad 90 which receives a high voltage $V_{pp}$ from an external device, and a switch 121 connected to pad 90. During some steps of a typical erase or program sequence (in which the cells of array 16 are erased or programmed), control unit 29 sends a control signal to switch 121 to cause switch 121 to close and thereby assert the high voltage $V_{pp}$ to various components of the chip including X decoder 12. Voltage $V_{pp}$ is higher (typically $V_{pp}$=12 volts) than the normal operating mode supply voltage (typically $V_{cc}=5$ volts or $V_{cc}=5.5$ volts) for the MOS transistors of chip 3.

When reading a selected cell of array 16, if the cell is in an erased state, the cell will conduct a first current which is converted to a first voltage in sense amplifier 19. If the cell is in a programmed state, it will conduct a second current which is converted to a second voltage in sense amplifier 19. Sense amplifier 19 determines the state of the cell (i.e., whether it is programmed or erased corresponding to a binary value of 0 or 1, respectively) by comparing the voltage indicative of the cell state to a reference voltage. The outcome of this comparison is an output which is either high or low (corresponding to a digital value of one or zero) which sense amplifier 19 sends to output buffer 20, which in turn asserts a corresponding data signal to I/O pad 30 (from which it can be accessed by an external device).

During the test mode, input buffer 18, sense amplifier 19, and output buffer 20 are all disabled (in response to appropriate levels of their respective control signals DATA DRIVER ON, SENSE AMPLIFIER ENABLE, and OUTPUT ENABLE, which are generated by control unit 29).

During a write operation in the normal operating mode, control signal SENSE AMPLIFIER ENABLE disables sense amplifier 19. During a read operation in the normal operating mode, circuit 14 is employed to access the desired cell in array 16 and control signal SENSE AMPLIFIER ENABLE enables sense amplifier 19 so that sense amplifier 19 can determine the state of the selected cell as described.

It is important during a write operation (in the normal operating mode) to provide the wordline of the selected cell with the proper voltage and the drain of the selected cell with the appropriate voltage level (the voltage determined by the output of input buffer 18), in order to successfully write data to the cell without damaging the cell.

Figure 2:
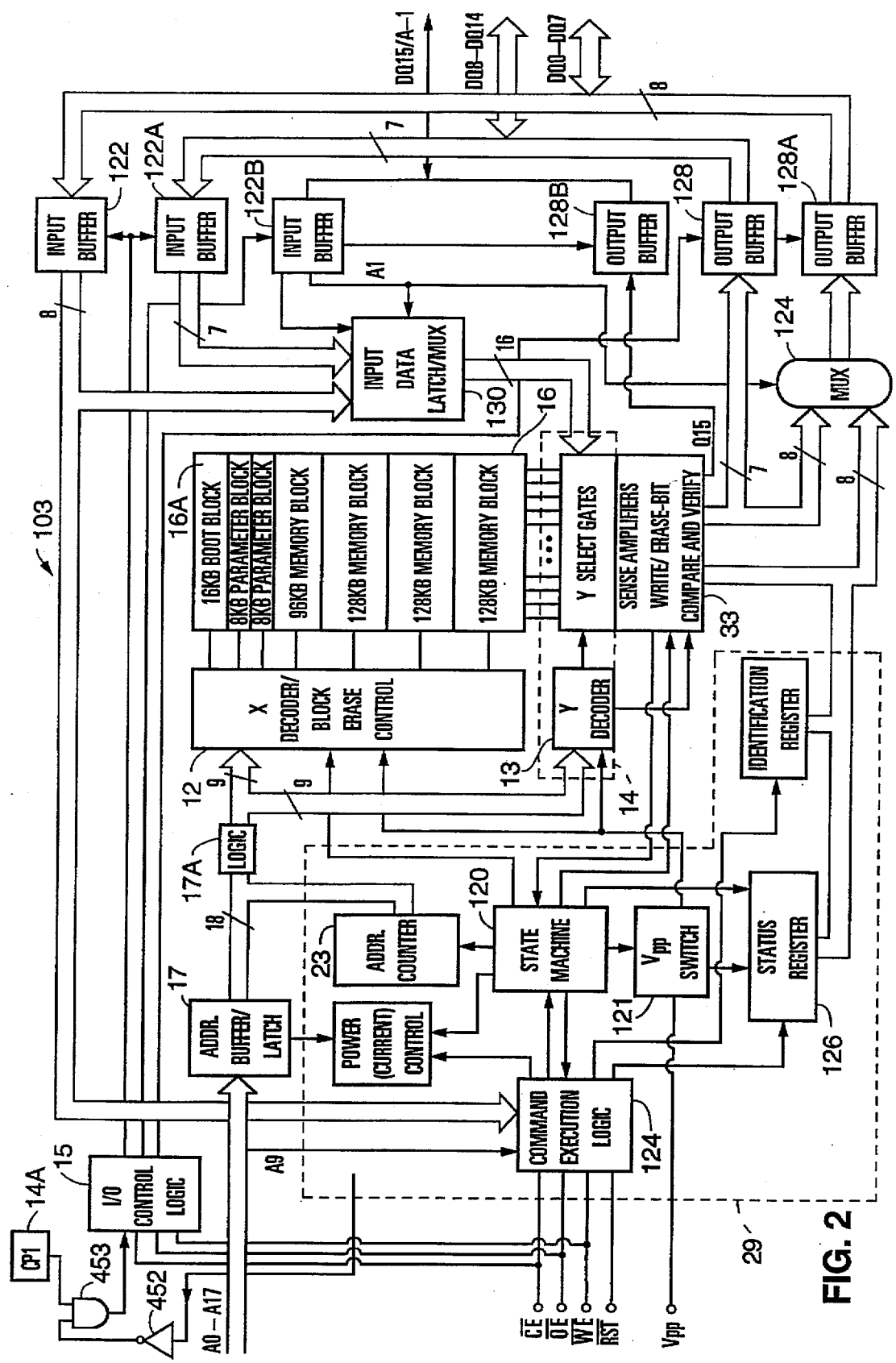
FIG. 2 is an overall block diagram of a memory system in accordance with the present invention, which includes circuit 17A containing a non-volatile data storage unit for storing control parameter data used for control of addressing polarity, and non-volatile data storage unit 14A for storing control parameter data used for controlling word length.

FIG. 2 is a block diagram of a flash memory chip 103 which is an integrated circuit memory system that is a variation on memory chip 3 of FIG. 1. Chip 103 performs essentially all the same functions as does chip 3, but includes additional elements (to be described) so as to embody the present invention. The components of flash memory system 103 which correspond to components of memory chip 3 of FIG. 1 are identified by identical reference numerals in FIGS. 3 and 1. Memory array 16 of system 103 consists of flash memory cells arranged in rows and columns. The individual cells (not depicted) are addressed by eighteen address bits (A0–A17), with nine bits being used by X decoder circuit 12 to select the row of array 16 in which the target cell is located and the remaining nine bits being used by Y decoder circuit 13 (of Y-multiplexer 14) to select the appropriate column of array 16.

Internal state machine 120 of control unit 29 of chip 103 controls detailed operations of chip 103 such as the various individual steps necessary for carrying out programming, reading and erasing operations. State machine 120 thus functions to reduce the overhead required of a processor (not depicted) typically used in association with chip 103.

Memory operations, including programming, reading, and erasing can be initiated in various ways. For all operations, the chip enable signal $\overline{CE}$ must be made active (low). To perform a read operation, write enable signal $\overline{WE}$ must be made inactive (high). For a write operation, signal $\overline{WE}$ must be made active (low). In order to reduce the likelihood of accidental modification of data, erase and program operations require receipt of two consecutive commands that are processed by command execution logic unit 124. The program and erase commands are provided by the associated processor to data I/O pins DQ0–DQ7, forwarded to input buffer 122, and then forwarded to the command execution logic unit 124 for processing.

If memory array 16 is to be erased (typically, all or large blocks of cells are erased at the same time), the processor causes the Output Enable $\overline{OE}$ pin to be inactive (high), and the Chip Enable $\overline{CE}$ and Write Enable $\overline{WE}$ pins to be active (low). The processor then issues an 8 bit command 20H (0010 0000) on data I/O pins DQ0–DQ7, typically called an Erase Setup command (one of I/O pins DQ0–DQ7 corresponds to I/O pad 30 of FIG. 1). This is followed by issuance of a second eight bit command D0H (1101 0000), typically called an Erase Confirm command. Two separate commands are used to reduce the possibility of an inadvertent erase operation.

The commands are transferred to data input buffer 122 (input buffer 18 of FIG. 1 corresponds to a component of buffer 122 which receives one bit of each command) and the commands are then transferred to command execution logic unit 124 of control unit 29. Logic unit 124 then instructs state machine 120 to perform all the numerous and well known steps for erasing array 16.

Once an erase sequence is completed, state machine 120 updates an 8 bit status register 126, the contents of which are transferred to data output buffer 128A which is connected to data I/O pins DQ0–DQ7 of the memory system (output buffer 18 of FIG. 1 corresponds to a component of buffer 128A which receives one bit from register 126). The processor periodically polls the data I/O pins to read the contents of status register 126 in order to determine whether an erase sequence has been completed and whether it has been completed successfully.

It is contemplated that in preferred embodiments of a memory chip implementing the invention, each memory cell in each memory array of the chip (e.g., array 16) is a nonvolatile memory cell such as a flash memory cell.

Generation of the control signals needed for entry into each of the test modes of the inventive memory chip is preferably accomplished in the manner described in U.S. patent application Ser. No. 08/508,924, entitled "Memory System Having Internal State Monitoring Circuit," filed on Jul. 28, 1995, and U.S. patent application Ser. No. 08/386,704 entitled "Apparatus for Entering and Executing Test Mode Operations for Memory," filed Feb. 10, 1995, the disclosures of which are hereby incorporated in full into the present disclosure by reference. Control unit 29 preferably includes the circuitry for generating the control signals needed for entry into each test mode (in response to signals received at external pads of the chip), and the circuitry for generating the control signals needed for controlling operation of the chip during execution of some test mode operations and for controlling operation of the chip in the normal operating mode.

Figure 4:
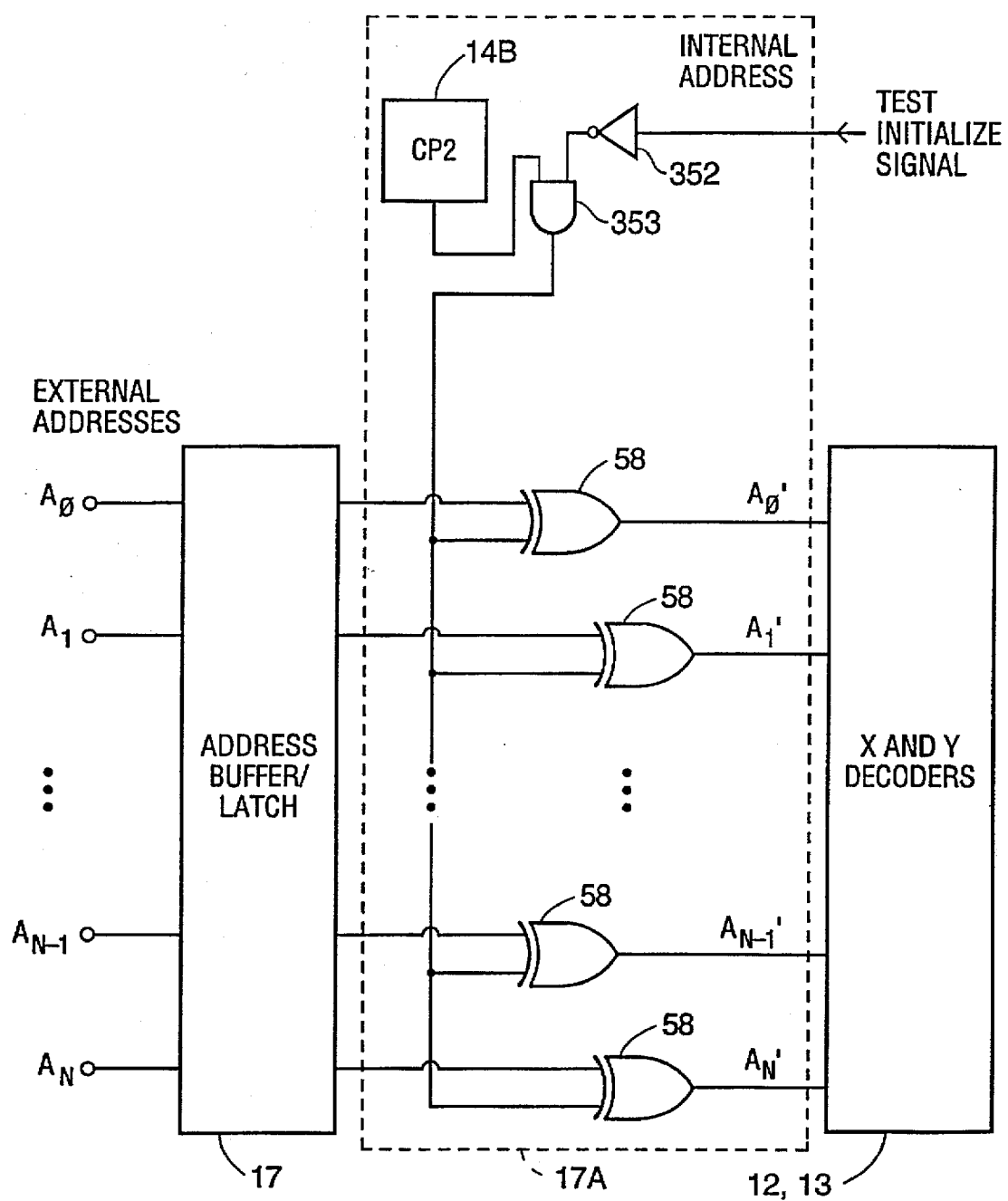
FIG. 4 is a schematic diagram of part of the FIG. 2 system showing circuit 17A (including non-volatile data storage unit 14B) for controlling addressing polarity based upon a stored control parameter.

The operation of chip 103 of FIG. 2 can be altered by stored control parameters CPN (e.g., parameter CP2 determined by data stored in data storage unit 14B of chip 103, shown in FIG. 4) which can themselves be changed any time after the chip has been fabricated. Different types of exemplary operations which can be controlled in this manner will next be described.

Word Length (Bus Size)

Chip 103 of FIG. 2 can be permanently configured using a stored programmable control parameter CP1 to provide either a total of 256K of eight bit words or a total of 128K of sixteen bit words. The state of this control parameter is determined by a bit stored in non-volatile data storage unit 14A (shown in FIG. 3). Data storage unit 14A can be of the type described below with reference to FIG. 6 and in above-cited U.S. application Ser. No. 08/508,864 (filed on Jul. 28, 1995), which is a non-volatile data storage unit having flash memory cells which permit a control parameter, such as parameter CP1, to be programmed to a desired state after fabrication of the memory system has been completed.

Control parameter CP1 is thus used to control the size of the memory system data bus, that is, the size of the data words of the memory. In the present example, the size is either an eight bit word or a sixteen bit word. The output of storage unit 14A is connected (through AND gate 453, discussed below) to I/O control logic unit 15 which controls the memory system input and output functions so as to provide either sixteen bit or eight bit word operation.

In the event the memory has been configured to read and write eight bit words (i.e., when control parameter CP1 is set to indicate eight bit words), a total of nineteen address bits are provided to chip 103 by the associated processor. Eighteen bits of address are forwarded to address terminals A0–A17 and then to address buffer (and latch) 17. The last address bit is provided to the A-1/DQ15 terminal (shown at the right side of FIG. 2), which is used as the least significant address A-1 when the memory is in an "eight bit word" configuration and as bit DQ15 of the sixteen bit data I/O (DQ0–DQ15) when the memory is in a "sixteen bit word" configuration.

Each addresses A0–A17 is forwarded to X decoder 12 and Y decoder 13 to select one sixteen bit word out of array 16. When a read operation is being performed, the sixteen bits read out of array 16 are forwarded to data multiplexer 124. I/O control logic unit 15 directs input buffer 122B to forward address A-1 to multiplexer 124, which responds by selecting either the lower or higher of the eight bit words of the sixteen bits read from memory, depending on the state of address bit A-1. The selected eight bits of output data are forwarded to output buffer 128A which, in turn, couples the output data to memory terminals DQ0–DQ7. In this mode (eight bit mode), the outputs of data output buffer 128, which are connected to terminals DQ8–DQ14, are set to a high impedance state.

If a memory program operation is to be performed (to write eight bits to memory 16) when the memory system is in the eight bit mode, the associated processor provides the eighteen most significant bits of address to terminals A0–A17 and the least significant bit to terminal DQ15/A-1. The eight bits of data to be programmed at that address are forwarded by the processor to terminals DQ0–DQ7 and then to data input buffer 122. The eight bits of data are then fed to input data latch/multiplexer 130 which selects the eight bits of data from input buffer 122 to be written to either the upper or lower half of the sixteen bits provided to Y select gate unit 14, based upon address A-1.

The eighteen bits of address A0–A17 are used by X decoder 12 and Y decoder 13 to select a sixteen bit word in array 16. Latch/multiplexer 130 further functions to force the deselected eight bits of its output to a disabled state so these bits will not be programmed. Thus, either the upper or lower half of the sixteen bit word addressed by decoders 12 and 13 will be programmed with the eight bits of data provided by latch/multiplexer 130. The deselected half will not be programmed.

In the event control parameter CP1 is set to indicate sixteen bit (rather than eight bit) words, the associated processor need provide only eighteen bits of address to chip 103. These address bits are applied to terminals A0–A17. If a read operation is to be performed, the eighteen bits of address are used by X decoder 12 and Y decoder 13 to select a sixteen bit word in array 16. Eight bits of the word are forwarded to multiplexer 124 which will forward these bits to output buffer 128A then to terminals DQ0–DQ7. An additional seven bits of the data read from array 16 are forwarded to output buffer 128 and then to terminals DQ8–DQ14. The sixteenth data bit DQ15 of the word is forwarded to output buffer 128B and then to dual function terminal DQ15/A-1.

In the event a memory program operation is to be performed when the system is in the sixteen bit mode, the eighteen address bits provided by the associated processor to terminals A0–A17 will select a sixteen bit word of array 16 to be programmed. The associated processor then forwards the sixteen bits to be programmed to terminals DQ0–DQ7, DQ8–DQ14, and DQ15/A-1. Fifteen of the data bits are received by input buffers 122 and 122A. The sixteenth bit is received by input buffer 122B. The outputs of buffers 122, 122A, and 122B are fed to latch/multiplexer 130 and then forwarded to Y select gates unit 14 to be programmed into the memory location selected by the eighteen address bits.

Figure 3:
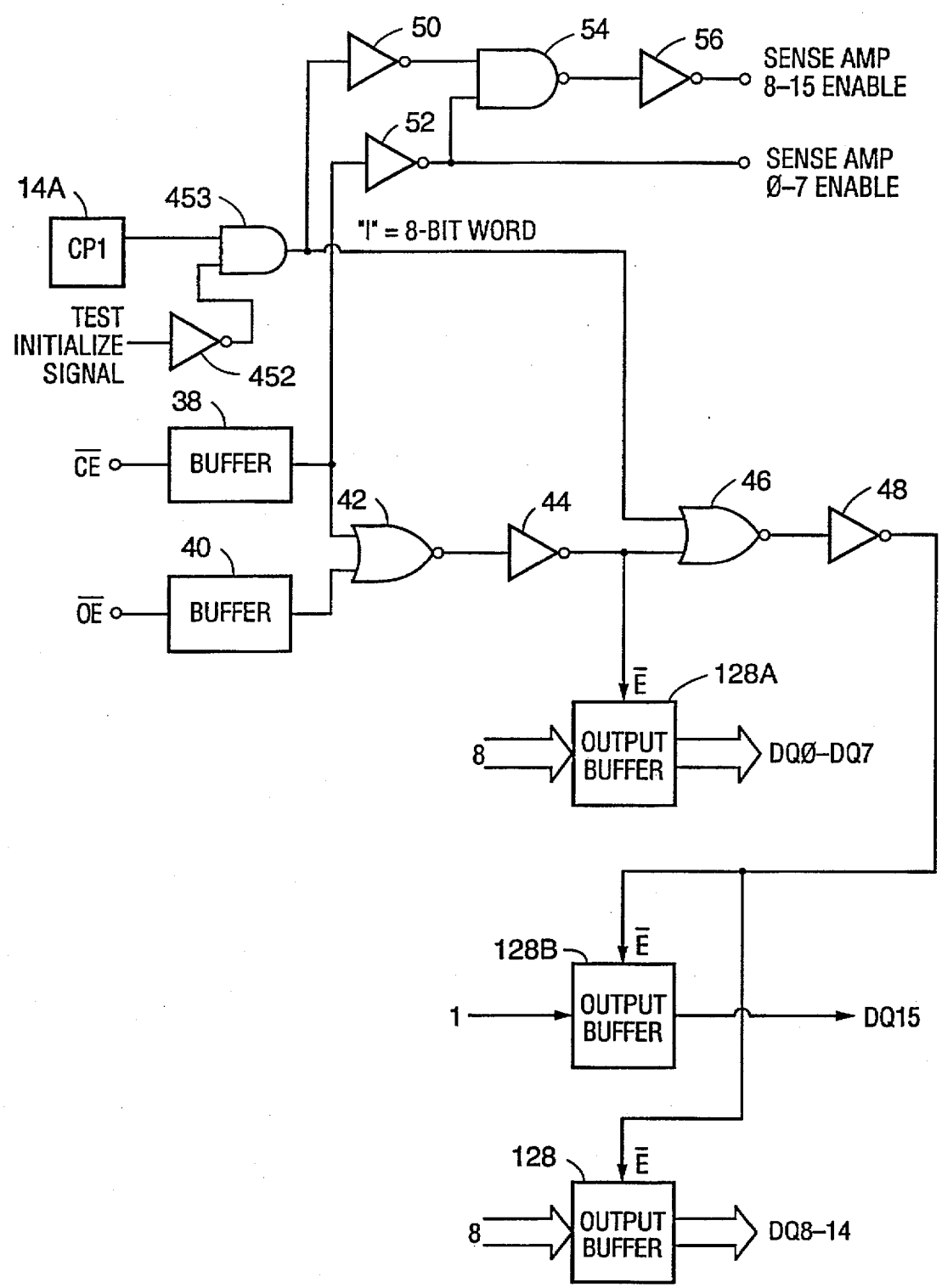
FIG. 3 is a schematic diagram of part of the FIG. 2 system showing details of circuitry (including non-volatile data storage unit 14A) for control of word length based upon a stored control parameter.

Additional details regarding the word size control feature of chip 103 of FIG. 2 will be described with reference to FIG. 3 (with reference to a read operation). Data storage unit 14A stores a bit which determines the value of word size control parameter CP1. A CP1 value of "1" indicates a word size of eight bits; a value of "0" indicates a word size of sixteen bits. As previously noted, signal $\overline{CE}$ is made active (low) for any memory system operation, and signal $\overline{OE}$ is made active (low) for a memory read operation. As shown in FIG. 3, signals $\overline{CE}$ and $\overline{OE}$ are buffered respectively by circuits 38 and 40 (which are elements of I/O control logic unit 15 of FIG. 2), and the outputs of circuits 38 and 40 are fed to the inputs of NOR gate 42. The output of gate 42 is inverted by inverter 44, with the output of inverter 44 functioning as an enable signal for data output buffer 128A. Thus, when signals $\overline{CE}$ and $\overline{OE}$ are both active, the low signal out of inverter 44 will cause outputs DQ0–DQ7 of output buffer 128A to be active. When either signal $\overline{CE}$ or $\overline{OE}$ is inactive, the output of buffer 128A goes to an inactive or high impedance state.

Still with reference to FIG. 3, the output of inverter 44 is also connected to an input of NOR gate 46. The other input of gate 42 is connected (through gate 352, to be described with reference to FIG. 9) to the output of data storage unit 14A for receiving a data signal representing the value of control parameter CP1. The output of gate 46 is inverted by inverter 48 which is coupled to the enable input of output buffer 128B and output buffer 128. When a read operation is being performed and when CP1 is a "1" indicating eight bit word length, both buffers 128 and 128B are disabled so that their outputs will be at a high impedance. Thus, eight bits of data will be provided by buffer 128A, as previously described. When CP1 is a "0", thereby indicating a sixteen bit word, all three buffers 128A, 128 and 128B are enabled so that all sixteen bits can be output therefrom.

Another aspect of operation of chip 103 (of FIG. 2) that is controlled by parameter CP1 pertains to sense amplifier block 33. Block 33 comprises a total of sixteen sense amplifiers, which are used to implement memory read operations, and also in program verification and in erase verification. As can be seen from FIG. 3, when signal $\overline{CE}$ is active (low), eight of the sense amplifiers, those associated with DQ0–DQ7, are made active in response to the high ("1") output of inverter 52. As also apparent from FIG. 3, the output of storage unit 14A is fed to inverter 50, the output of inverter 50 is fed to one input of NAND gate 54, the output of inverter 52 is fed to the other input of gate 54, and the output of gate 54 is inverted by inverter 56. Accordingly, when CP1 is set to a "1" indicating eight bit operation, the output of inverter 56 is a "0" thereby causing the sense amplifiers associated with DQ8-DQ15 to be disabled. When CP1 is a "0" indicating sixteen bit operation (and $\overline{CE}$ is low), the output of inverter 56 is a "1" and all of the sixteen sense amplifiers are enabled.

Top/Bottom Addressing

As shown in FIG. 2, memory array 16 is divided into several blocks of memory cells. The system is implemented so the memory can be erased in blocks rather than by bulk erasure (in which the entire memory is erased). Among the blocks is one (block 16A) of the type commonly referred to as a boot block. Boot block 16A is intended to contain the kernel code used to initialize the system at power on. Typically, boot block 16A is hardware protected so that it cannot be erased unless special steps are taken.

At power on, the processor associated with chip 103 is typically automatically directed to read the data stored in boot block 16A so that chip 103 can be initialized. Some processors will attempt to start reading of the boot block data at address 3FFFF(H) (A0-A17 are all "1") and other processors will attempt to start reading the boot block data at address 00000(H) (A0-A17 are all "0"). These two approaches are sometimes called top and bottom addressing, respectively.

By writing control parameter data into a non-volatile data storage unit, a memory system (such as chip 103 of FIG. 2) can be configured after fabrication to perform either top or bottom addressing. This eliminates the necessity of fabricating both types of memory systems. FIG. 4 is a more detailed diagram of a portion of chip 103 showing the manner in which the system is configured to provide either top or bottom addressing after fabrication, in response a control parameter CP2 determined by a single bit stored in unit 14B.

With reference to FIG. 4, parameter CP2 is stored in non-volatile programmable data storage unit 14B (included in chip 103 but not shown in FIG. 2). Storage unit 14B can have identical design to that of storage unit 14A which stores parameter CP1. If CP2 is a "0", the external addresses A0-AN output from circuit 17 are left unchanged. Thus, if the processor initially looks for boot block data to begin at address 00000 (H) and that is the internal address of the boot block, no changes are made to the external addresses, and the internal addresses applied to the X and Y decoders 12, 13 are the same as the external addresses output from circuit 17. The parameter CP2 would also be a "0" if the processor initially looks at address 3FFFF(H) and that is, if fact, the internal address of boot block 16A.

If the processor initially looks at address 3FFFF(H) for the boot block data and the actual boot block is located beginning at 00000(H), then the bit stored in unit 14B determines parameter CP2 to be a "1". The same would be true if the initial processor address is 00000(H) and the actual starting address is 3FFFF(H).

The circuitry shown in FIG. 4 includes one XOR (exclusive OR) gate 58 for each of the "N" external address bits A0-AN. Address bits A0-AN are forwarded to address buffer/latch 17 and each address bit is then asserted from circuit 17 to an input of a different XOR gate 58. The other input of each XOR gate 58 is connected to data storage unit 14B in which the data determining parameter CP2 is stored.

If CP2 has been programmed to a "0", XOR gates 58 will simply forward the external addresses to X and Y decoders 12, 13 (as described above). However, if CP2 has been programmed to a "1", XOR gates 58 will invert the external addresses output from circuit 17 in order to create internal addresses that are asserted to X and Y decoders 12, 13.

Sense Amplifier Reference Voltage

As discussed above, the sense amplifiers represented by block 33 of FIG. 2 are used in various memory functions, such as memory read operations in which the programmed state of cells in array 16 is ascertained. The sense amplifiers are also used to verify proper programming of the cells and to verify proper erasure of the cells. In all these operations, a voltage is developed which is indicative of current flow through each cell being sensed. That sensing voltage is compared to a reference voltage by the sense amplifier. Typically, one reference voltage used in read operations and program verify operations, and another reference voltage is used in erase verification operations.

Because some embodiments of the invention control levels of reference voltages (during test mode operation of a memory system such as chip 103), further description of the way in which chip 103 generates and uses reference voltages may be helpful. With reference to FIG. 2, memory system 103 contains control unit 29, which in turn includes internal state machine 120, command execution logic 124, other elements shown in FIG. 2, and typically also additional elements (to be discussed) not shown in FIG. 2 for simplicity. State machine 120 controls detailed operations of the system, such as the various individual steps necessary for carrying out programming, reading and erasing operations. State machine 120 thus functions to reduce the overhead required of the processor (not depicted) typically used in association with system 103.

If memory cell array 16 is to be erased (either in bulk or by block), the associated processor will cause the output enable $\overline{OE}$ pin to be inactive (high), and the chip enable $\overline{CE}$ and write enable $\overline{WE}$ terminals to be active (low). The processor then issues the above-described Erase Setup and Erase Confirm commands.

The commands are transferred to data input buffer 122 and then transferred to command execution logic unit 124. Logic unit 124 then instructs state machine 120 to perform all of the numerous and well known steps for erasing array 16. Once the erase sequence is completed, state machine 120 updates 8 bit status register 126, the contents of which are transferred to through multiplexer 124 to data output buffer 128A which is connected to data I/O terminals DQ0-DQ7 of chip 103.

Figure 5A:
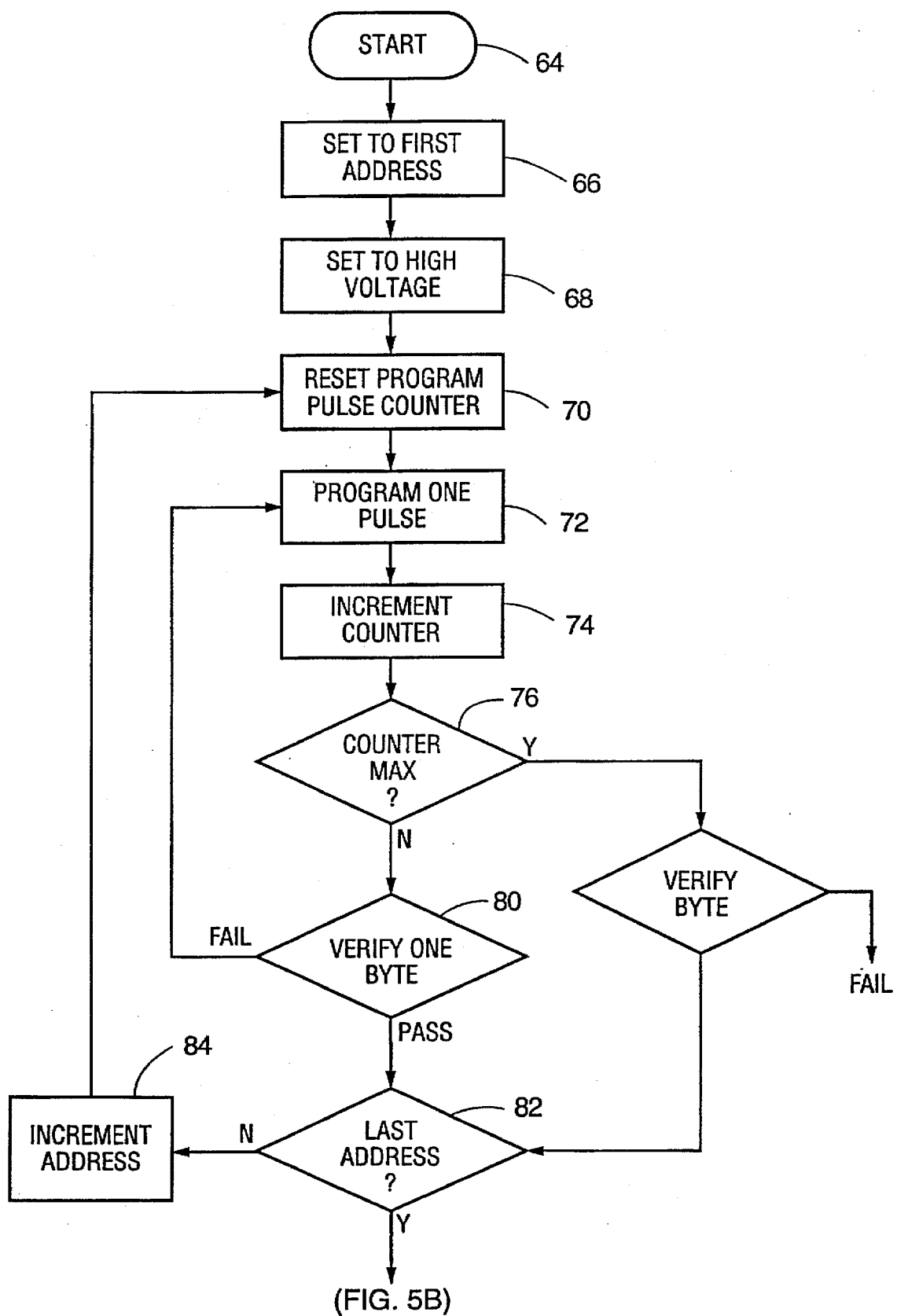
FIGS. 5A and 5B are a flow chart showing operation of the memory system state machine.
Figure 5B:
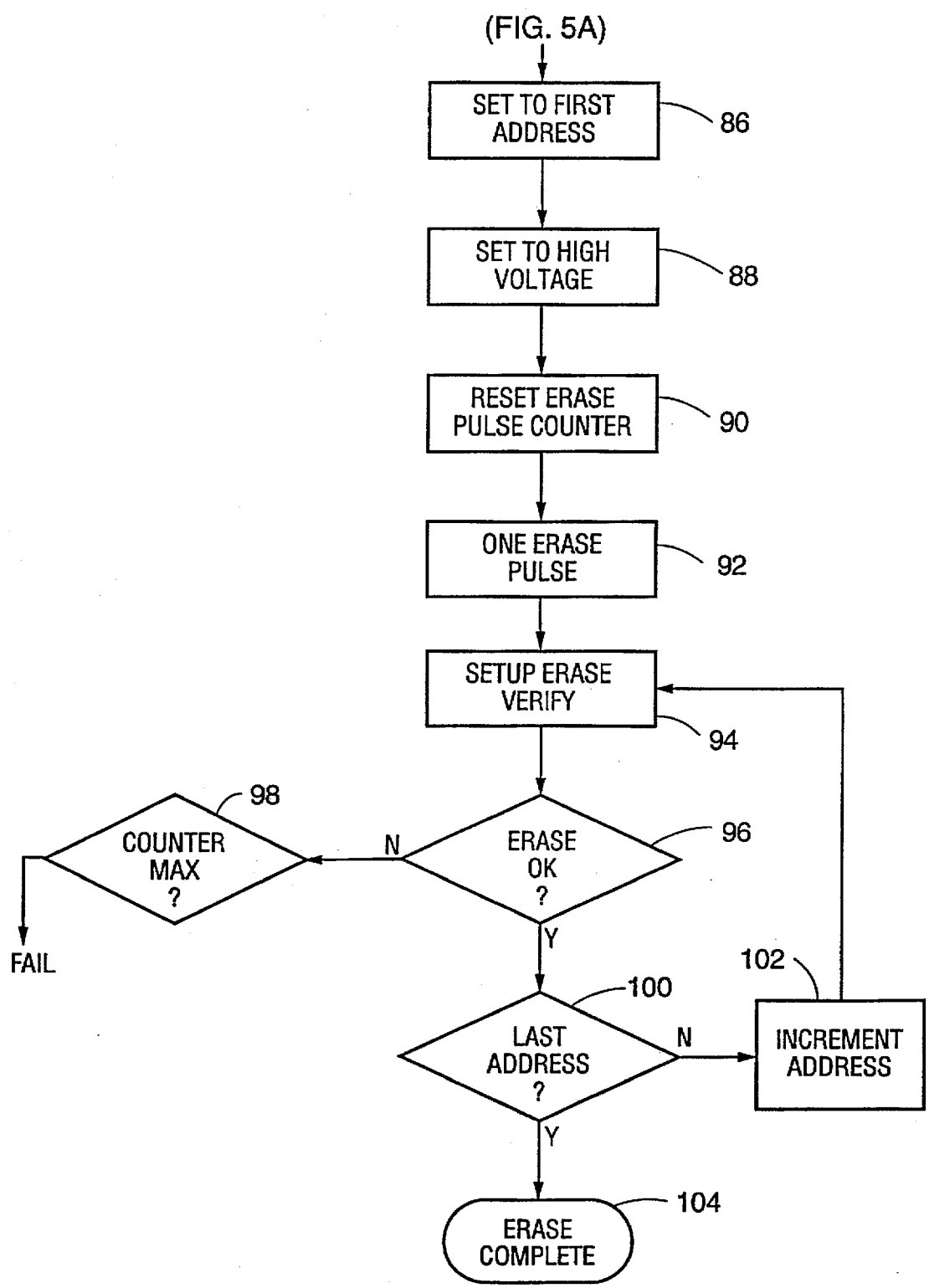

FIGS. 5A and 5B are a flow chart showing a typical erase sequence as it is carried out by state machine 120. It should be understood that during any erase operation, there is a possibility that one or more cells of array 16 will become what is termed "overerased." The objective of the erase sequence is to erase all the cells of array 16 so that the threshold voltages are all within a specified voltage range (typically a small positive voltage range such as +1.5 to +3.0 volts). If the erased cells fall within this range, the cell to be read (the selected or target cell), will produce a cell current in a read operation. The presence of cell current flow indicates that the cell is in an erased state (logic "1") rather than a programmed state (logic "0").

Cell current is produced in an erased cell because the voltage applied to the control gate, by way of the word line from the array connected to the X decoder 12, exceeds the threshold voltage of the erased cell by a substantial amount. In addition, cells which are not being read, the deselected cells, are prevented from producing a cell current even if such cells have been erased to a low threshold voltage state. By way of example, for cells located in the same row as the selected cell, by definition, share the same word line as the selected cell. However, the drains will be floating thereby preventing a cell current from being generated. Deselected cells in the same column will not conduct cell current because the word lines of such deselected cell are typically grounded. Thus, the gate-source voltage of these cells will be insufficient to turn on these deselected cells even if they are in an erased state.

Once array 16 has been erased, the vast majority of cells will have a proper erased threshold voltage. However, it is possible that a few of the cell, or even one, may have responded differently to the erase sequence and such cells have become overerased. If a cell has been overerased, the net charge on the floating gate will be positive. The result will be that the threshold voltage will be negative to some extent. Thus, when the word line connected to such overerased deselected cells is grounded, the deselected cells will nevertheless conduct current. This current will interfere with the reading of the selected cell thereby preventing proper memory operation. A principal objective of the erase sequence of FIGS. 5A and 5B is to prevent the overerase condition from occurring. As indicated in FIG. 5A, the erase sequence is initiated (element 64) by issuance of the two above-noted erase commands. Once the commands have been received by command execution logic 124, internal state machine 120 will first cause all of the cells of array 16 to be programmed. This is done so that all cells are in essentially the same condition when they are subsequently erased. This reduces the likelihood that one or more of the cells will become overerased since all of the cells will have an increased tendency to respond to the subsequent erase sequence in the same manner. As indicated by block 66, an address counter 23 (FIG. 2) is initialized to the first address of the memory. Next, as indicated by block 68, the voltages used for programming are set to the proper level, including setting high voltage $V_{pp}$ to +12 volts (element 121 of FIG. 2).

Once the voltages are set, an internal program pulse counter (not depicted) is initialized as shown by block 70. This counter keeps track of the number of programming pulses that have been applied to the cells of the word (byte) being programmed. Next, a programming pulse is applied to the cells of the word located at the first address of the memory, as indicated by block 72. The pulse counter is then incremented (block 74) and a determination is made as to whether a predetermined maximum number of pulses have been applied to the cells (element 76). If that is the case, the cells are read to determine whether the cells have, in fact, been programmed (78). This is accomplished using the sense amplifiers and associated components represented by block 33 of FIG. 2.

If the cells are still not programmed at this point, there has been a failure since he maximum number of programming pulses has been exceeded. Depending upon the particular memory, the sequence will be terminated or a record of the failed word will be made and the sequence continued. This information will then be transferred to the status register 126 (FIG. 2) so that it can be read by the processor. One potential cause of such a failure is that the memory endurance may have been exceeded. In other words, the memory has been cycled too many times.

Assuming that the maximum count has not been exceeded, the byte is verified as indicated by element 80. If the byte has not been programmed, a further programming pulse is applied (block 72) and the counter is incremented (block 74). Assuming that the maximum count has still not been exceeded, the byte is again verified (element 80). This sequence will continue until the byte finally passes the verification test or until the pulse counter is at the maximum.

Assuming that the first byte is eventually successfully programmed, a determination is made as to whether the last address of array 16 has been programmed (element 82). Since that is not the case, address counter 23 will be incremented to the second address (block 84) and the internal pulse counter reset (block 70). A first programming pulse will be applied to the byte of the second address (block 72) and the sequence will be repeated. This process will continue until all cells of array 16 have either been programmed or until a determination is made that there is a programming failure.

Assuming that all of the cells have been successfully programmed and verified, state machine 120 will continue the erase sequence by setting the appropriate voltages used for erasing, including the initialization of address counter 23 (block 86 of FIG. 5B) and the setup of the appropriate voltages for erasing, including voltage $V_{pp}$ (block 88).

Next, an internal erase pulse counter is reset (block 90) and a single erase pulse is applied to all of the cells of the array (or to the block of the array being erased). The cells of the array will then be sequentially read in order to determine whether all cells have been successfully erased. First, the conditions necessary for erase verification, namely those for cell reading, are set up (block 94) and the first cell of the array is read.

A single erase pulse is almost never sufficient to accomplish an erasure so that this test (element 96) will almost always fail. The state of the erase pulse counter is then examined (element 98) and a determination is made that the maximum count has not been exceeded. Accordingly, a second erase pulse is applied to the entire array 16 (element 92) and the first byte is again tested (element 96).

Once the byte has received a sufficient number of erase pulses and has passed the verification test (element 96), the address is incremented (block 98) and the second byte is tested (elements 94 and 96) to determine whether the second byte has been successfully erased. Since the cells are not always uniform, it is possible that the second byte has not be erased even though it has received the same number of erase pulses received by the first byte. In that event, a further erase pulse is applied to the entire array 16 and the second byte is again tested for a proper erase. Note that the address is not reset at this point since it is not necessary to retest those bytes that have already been erased. However, there is a possibility that those earlier erased bytes will become overerased, as will be explained.

Once it has been established that the second byte has been properly erased, a determination is made as to whether the last address of the Array has been verified (element 100). Since that is not the case, address counter 23 is incremented (element 102) and the third byte is tested. Additional erase pulses will be applied if necessary. The internal erase pulse counter (element 98) will monitor the total number of erase pulses applied in the erase sequence. If a maximum number has been exceeded, the sequence will be terminated and one of the bits of status register 126 will be set to reflect that an erase error has occurred.

Assuming that the second byte of cells has been properly erased, the remaining bytes will be verified and any necessary additional erase pulses will be applied. Once the last address has been verified, the erase sequence is ended and status register 126 is updated to indicate that the erase sequence has been successfully completed.

Although not shown in the flow chart of FIGS. 5A/5B, many memory systems provide operations for reducing the distribution of the erased threshold voltages and for correcting for cells which have been overerased. This is done by a process sometimes referred to as a heal operation. In a heal operation, the array bit lines are left open and the source lines are grounded. A high voltage, typically +12 volts, is applied to all of the word lines of the array 12. The high voltage is applied in the form of a pulse, with the heal operation typically requiring application of multiple pulses. These conditions cause electrons to be transferred to the floating gates of all of the cells of the array thereby increasing the threshold voltage. Cells which have been overerased will have a higher amount of charge transferred to them so that their threshold voltage will be increased more than the other cells. This process will move the overerased threshold voltage from a negative value to a positive value. Since the cells having negative threshold voltages (overerased cells) and those having small positive threshold voltages will be affected more than other cells, this process will have a tendency to reduce the voltage distribution of all of the cells and to correct for the overerased cells.

As previously described, the sense amplifiers are used for sensing voltages indicative of flash memory cell current under different operating conditions. Some embodiments of the present invention assume that various reference voltages used by the sense amplifiers for comparison to the sensed voltages are adjusted or trimmed (to values determined by control parameters stored in non-volatile data storage units), and these embodiments provide a means for asserting default values of such voltages at desired times during system operation (e.g., during initialization of a test mode). Before describing such embodiments, a more detailed description of such a non-volatile data storage unit is provided with reference to FIGS. 6 and 7.

Figure 6:
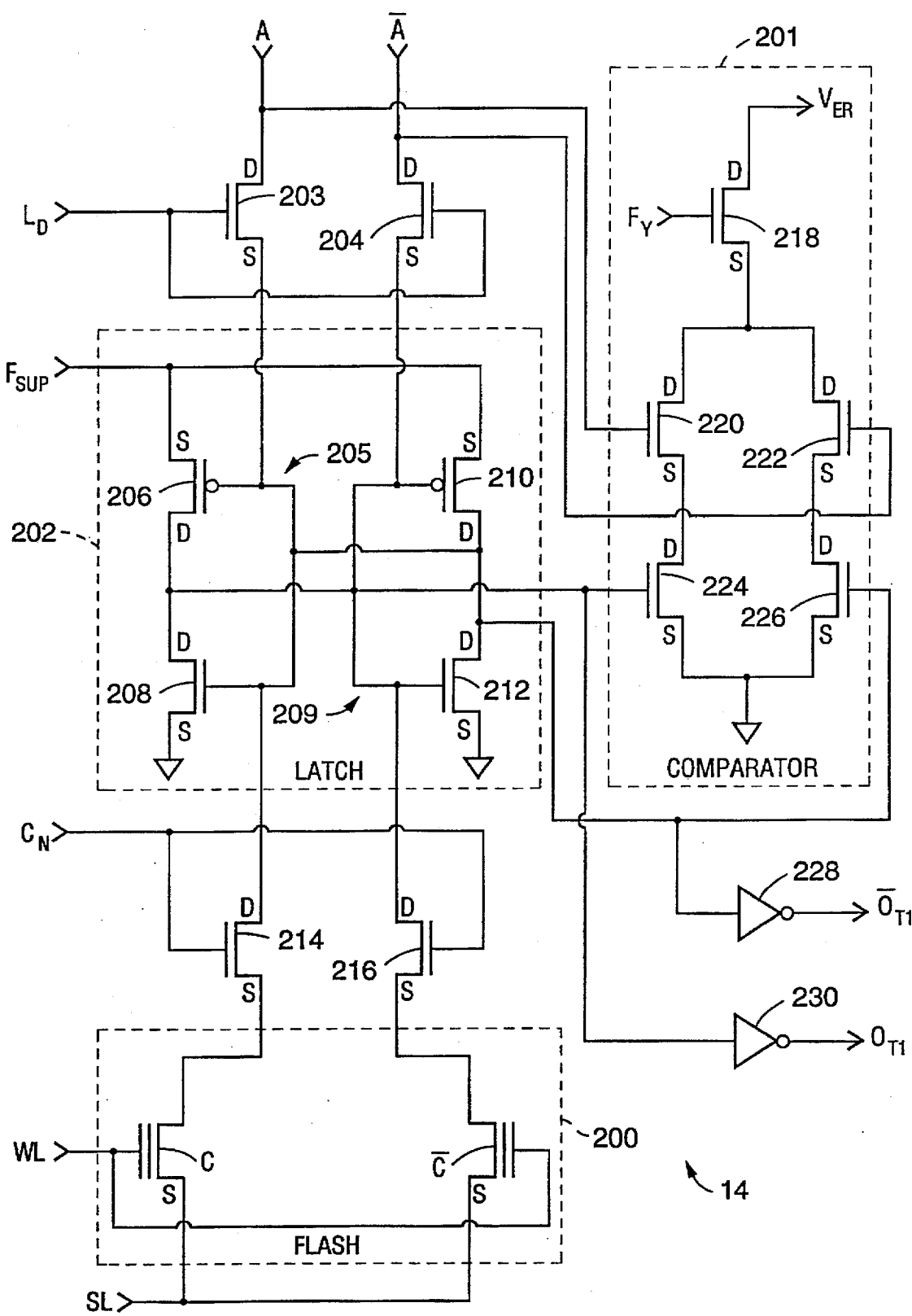
FIG. 6 is a schematic diagram of a data storage unit used for storing control parameter data.

FIG. 6 is a detailed schematic diagram of a data storage unit 14 suitable for use in connection with the invention for storing data determining a control parameter CP (e.g., CP1 or CP2 discussed above). Data storage unit 14 of FIG. 6 is capable of storing a single bit of control parameter data. Multiple bits can be stored by simply providing a separate storage unit 14 for each bit. The storage unit includes a non-volatile memory or flash section 200, a volatile latch section 202 and a comparator section 201. The flash section includes a pair of flash memory cells C and $\overline{C}$ for storing one bit of control parameter data in complementary form. As is well known, a flash cell utilizes a floating gate transistor having a drain, source, floating gate and control gate. Data is stored in the cell by adding or removing charge from the floating gate. Erasure is accomplished by removing charge by way of Fowler-Nordheim tunneling from the floating gate through a thin gate oxide disposed intermediate the floating gate and the cell channel. The flash cells have their common source regions connected to a common source line which receives signal $S_L$ and their control gates connected to a common word line which receives signal $W_L$.

Latch section 202 includes a pair of cross-coupled inverters which form a latch circuit. First inverter 205 includes a P channel transistor 206 connected in series with an N channel transistor 208. The common drain connections of transistors 206 and 208 form the output of the inverter and the common gate connection form the input. Second inverter 209 includes a P channel transistor 210 connected in series with an N channel transistor 212. The common drain connection of transistors 210 and 212 form the output of the second inverter 209 and the common gate connection forms the input.

As previously noted, the two inverters of latch section 202 are connected to form a latch circuit. In particular, the output of first inverter 205, the common drain connection of transistors 206 and 208, is connected to the input of second inverter 209, the common gate connection of transistors 210 and 212. The output of second inverter 209, the common drain connection of transistors 210 and 212, is connected back to the input of first inverter 205, the gates of transistors 206 and 208.

The output of first inverter 105 of latch section 202 is connected to the drain of flash cell $\overline{C}$ by way of a N channel transistor 216 and the output of second inverter 209 is connected to the drain of flash cell C by way of N channel transistor 214. The gates of the two connect transistors 214 and 216 are connected to a common control line which carries signal $C_N$.

Latch section 202 is powered by applying a voltage $F_{SUP}$ to the sources of transistors 206 and 210. Data to be loaded into latch section 202 is provided in complementary form A and $\overline{A}$ by way of N channel transistors 203 and 204. The common gates of the transistors 203 and 204 are connected to a line which receives a load signal $L_D$. Transistor 203 functions to couple data input A to the input of first inverter 205 of latch section 202 and transistor 204 functions to couple data input $\overline{A}$ to the input of second inverter 209.

The two complementary outputs of latch section 202 are coupled to respective inverters 228 and 230. The outputs of inverters 228 and 230 form the complementary outputs $O_{T1}$ and $O_{T1}$ of the data storage unit. The outputs of latch section 202 are also coupled to respective inputs of comparator circuit 201. The data inputs A and $\overline{A}$ are also coupled to respective inputs of comparator circuit 201. As will be explained, circuit 201 functions to compare the data stored in latch section 202 with the data inputs A and $\overline{A}$ so that the state of the latch section can be verified. Typically, the output of comparator section 201, signal $\overline{V}_{ER}$, is wire ORed to other comparator sections 201 associated with other data storage units so that a single verification signal $\overline{V}_{ER}$ can be used to indicate whether there is a match between the contents of latch section 202 and the associated data inputs A and $\overline{A}$ among several data storage units.

Comparator section 201 includes five N channel transistors 218, 220, 224, 222 and 226. Transistor 218 is coupled between the comparator output $\overline{V}_{ER}$ and the common drain connection of transistors 220 and 222. In addition, the gate of transistor 218 is connected to receive signal $F_V$ which is active when the state of comparator section 201 is to be sampled. Transistors 220 and 224 are connected in series, with the gate of transistor 224 connected to receive data input A and the gate of transistor 224 connected to receive the output of the first inverter 205 of latch section 202. Similarly, transistors 222 and 226 are connected in series, with the gate of transistor 222 connected to receive data input $\overline{A}$ and the gate of transistor 226 connected to receive the output of the second inverter 209 of latch section 202. As will be explained, when the complementary data inputs A and $\overline{A}$ match the complementary outputs of the two latch section inverters, the output of the comparator circuit 201, $\overline{V}_{ER}$ will be high, otherwise the output will be low.

There are a total of five operations which storage unit 14 can perform, including Load, Erase, Program, Recall and Verify. These operations will each be described in connection with the timing diagram of FIG. 7 together with the schematic diagram of FIG. 6. As will be explained in greater detail, the flash cells C and $\overline{C}$ are programmed by first loading the programming data into latch section 202. In addition, the flash cells C and $\overline{C}$ are read by transferring the contents of the flash cells to latch section 202.

Load

The function of the Load cycle is to set latch section 202 to a known state based upon complementary input data A and $\overline{A}$. The Load operation is required prior to the Program operation to ensure that latch circuit 202 is at the desired state.

The beginning of the Load cycle is indicated by time $T_0$. Following time $T_0$, the input data A and $\overline{A}$ is applied to the drains of transistors 203 and 204. Once the input data are stabilized, the load signal $L_D$ is made active thereby turning on transistors 203 and 204. In addition, the latch section 202 supply voltage $F_{SUP}$ is maintained at its nominal primary supply voltage $V_{cc}$ level of +5 volts. Assuming, for example, that A is a high level, the input of the first inverter 205, the common gates of transistors 206 and 208 are pulled up to a high level. At the same time, complementary signal $\overline{A}$ will be at a low level and will tend to pull the input of the second inverter 209, the gates of transistors 210 and 212, down to a low level by way of load transistor 204.

This combined opposing action on the inputs of the two inverters forces the output of first inverter 205 to a low state and the output of second inverter 209 to a high state. Latch section 202 will hold or store this data until it is altered by a subsequent Load operation, until it is changed by a Recall operation (as will be explained) or until the power is removed from the system. Load transistors must be of sufficient size so as to be capable of forcing the latch section 202 transistors to the desired state.

Erase

The operation for erasing the flash cells C and $\overline{C}$ commences at time $T_1$. This cycle is performed directly on the cells rather than by way of latch section 202. The connect signal $C_N$ is inactive in this operation so that both connect transistors 214 and 216 will be non-conductive. Thus, the drains of cells C and $\overline{C}$ will be left floating. In addition, signal $W_L$ connected to the word line of the two cells is grounded and the signal $S_L$ connected to the sources of the two cells is raised to a large positive voltage such as +12 volts. As is well known, under these conditions, the cells C and $\overline{C}$ will both be erased by way of Fowler-Nordheim tunneling. The flash section 200 must then be appropriately programmed so that the cells C and $\overline{C}$ will store complementary data.

Program

The Programming cycle commences at time $T_2$. As previously noted, the latch section 202 must have been previously set to the desired programmed state of the flash section 10. Load signal $L_D$ is inactive so that transistors 203 and 204 are off. The supply voltage $F_{SUP}$ is at a nominal value of +6 volts. Assume, for example, that the latch section 202 had previously been set such that the output of inverter 205 is at a low level and the output of inverter 209 is at a high level. In that event, the drain of transistor 214 will be close to the supply voltage $F_{SUP}$ and the drain of transistor 216 will be close the circuit common.

The connect signal $C_N$ is made active (high) shortly after time $T_2$, thereby turning on transistors 214 and 216 and effectively connecting supply voltage $F_{SUP}$ and circuit common to the drain of cells C and $\overline{C}$, respectively. The connect signal $C_N$ switches to a high level of +12 volts in the Programming cycle so that transistors 214 and 216 have a sufficient gate-source voltage to connect the supply voltage $F_{SUP}$ of +6 volts to either one of the drains of cells C and $\overline{C}$ depending upon the data stored in the latch. In this case, cell C will get the $F_{SUP}$ on its drain. At the same time, the control gates of the cells C and $\overline{C}$ are connected to word line signal $W_L$ having a magnitude equal to +12 volts. In fact, in many cases $C_N$ and $W_L$ can be the same signal. The source line signal $S_L$ is at circuit common and is connected to the common sources of cells C and $\overline{C}$. This combination of voltages applied to cell C will cause the cell to be programmed whereas those applied to cell $\overline{C}$ will not result in programming of the cell. In order to enable the cells C and $\overline{C}$ to be programmed to opposite states, it is necessary to first erase both cells in an Erase cycle prior to performing the Programming cycle. As previously noted, the latch section 202 must have also been previously set in order to carry out a Programming cycle.

Transistor 210 of inverter circuit 209 will provide the programming current, which is typically 500 microamperes, to cell C. If cell $\overline{C}$ is being programmed, the programming current is provided by transistor 206 of inverter circuit 205. Thus, transistors 206 and 210 of the latch section 202 must be of sufficient size to be able to conduct these programming currents. As previously noted, transistors 203 and 204 must also be sized so that they have sufficient strength to force transistors 206 and 210 to a desired state during the Load cycle. Typically, the programming voltages will be applied for a relatively long duration ranging from a few hundred microseconds to a millisecond. Since the data is stored in cells C and $\overline{C}$ in complementary form and since, as will be explained, the cells will be read in a differential manner, there is a large error tolerance margin. Accordingly, it is not necessary to perform any type of program verification as is frequently done in flash memory systems to confirm that the data has been properly programmed.

Recall

Figure 7:
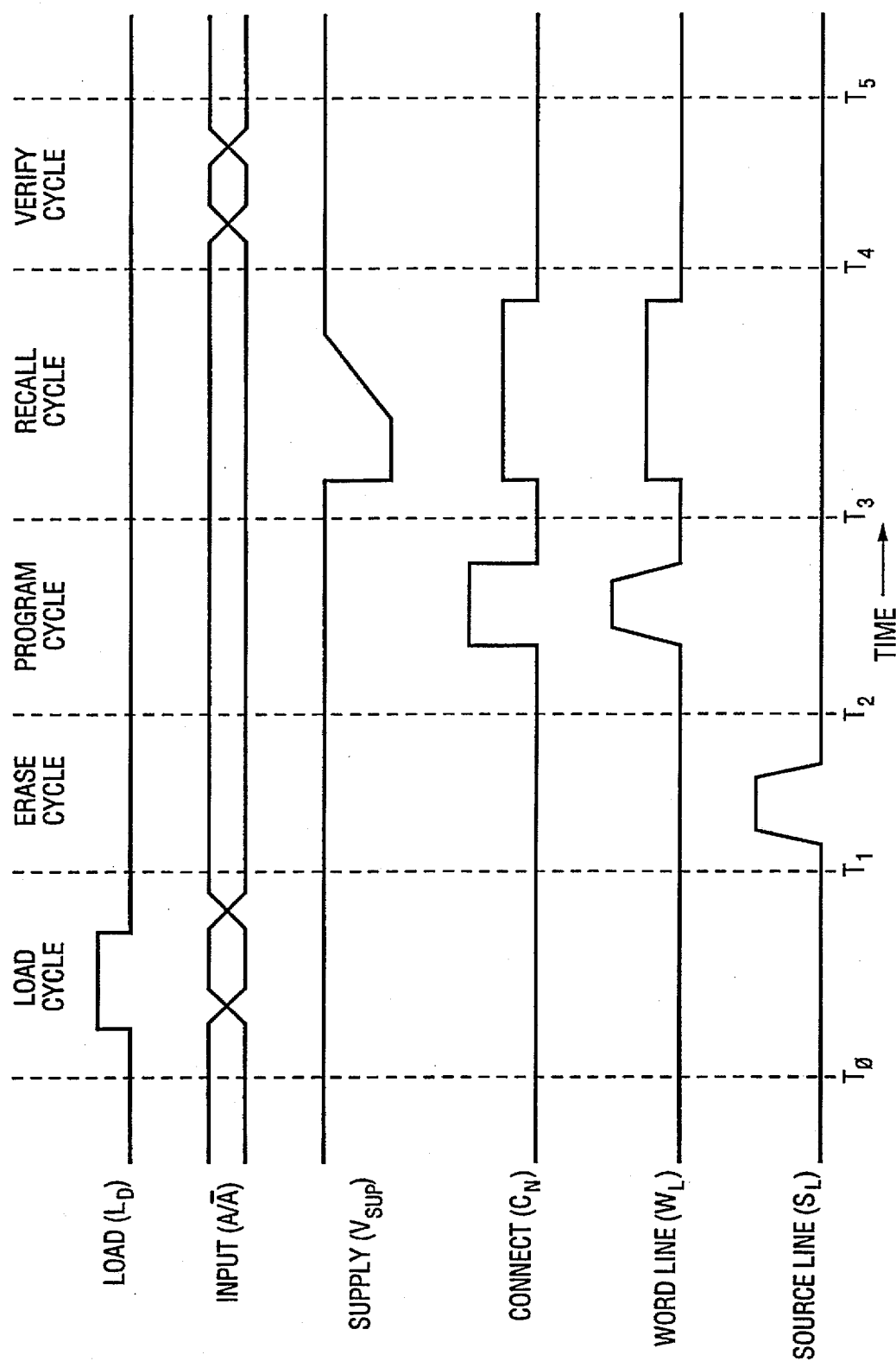
FIG. 7 is a timing diagram illustrating various functions that can be carried out by the data storage unit of FIG. 6.

The Recall cycle is illustrated in FIG. 7 beginning at time $T_3$. In this operation, the complementary states of cells C and $\overline{C}$ are transferred to the latch section 202. When power is removed from data storage unit 14, the data is not retained in volatile latch section 202. Accordingly, when power is reapplied, initialization circuitry is used to cause the transfer of the data stored in the non-volatile cells C and $\overline{C}$ to latch section 202.

Since the flash cells C and $\overline{C}$ have a limited drive capability and would not normally have sufficient strength to force the transistors of the latch section 202 to a desired state, the supply voltage $F_{SUP}$ is momentarily dropped to a low level approaching ground potential in the initial stage of the Recall operation. In addition, the connect signal $C_N$ is made active thereby connecting the flash section 200 to the latch section 202 by way of transistors 214 and 216. The word line of cells C and $\overline{C}$ is connected to a signal $W_L$ having a magnitude equal to the primary supply voltage $V_{cc}$ of typically +5 volts. Again, signals $W_L$ and $C_N$ can be the same signal for this operation.

The Recall cycle is preferably initiated by some form of power-on-reset circuit which will cause the Recall cycle to be performed at power on and when the primary supply voltage $V_{cc}$ drops to some predetermined level which would possibly affect the state of the latch section 202. The Recall cycle is initiated by the power-on-reset circuit when the circuit has detected that the primary supply voltage $V_{cc}$ has ramped up to about +3 volts after initial power on or has ramped up to about +3 volts after a drop in voltage $V_{cc}$ below that level.

During the Recall cycle, the common source line signal $S_L$ is also set to ground potential. Assuming that cell C has been programmed and cell $\overline{C}$ is in an erased state, cell C will be non-conductive so that the input of inverter 205 of the latch section 202 will not be affected. Cell $\overline{C}$ will be conductive and tend to pull the input of inverter 209 of latch section 202 down to ground potential.

Since the latch section 202 is not powered at this point, cell $\overline{C}$ is capable of pulling the input of inverter 209 down to a low level despite the limited drive capability of the cells. As can be seen from the FIG. 13 timing diagram, voltage $V_{SUP}$ is held to a low value momentarily and then is increased to the normal operating level. Preferably, the voltage is increased at a slow rate.

As the supply voltage $V_{SUP}$ increases, the cell $\overline{C}$ will continue to hold the input of inverter 209 at a low level so that P channel transistor 210 will proceed to turn on. This will cause the output of inverter 209 to be high which will, in turn, cause the input of inverter 205 to also be high. Thus, transistor 208 of inverter 205 will also begin to turn on thereby causing the output of inverter 205 to go low thereby reinforcing cell $\overline{C}$ in pulling down the input of inverter 209. Eventually, the supply voltage $V_{SUP}$ will be at the normal high voltage of $V_{cc}$ or typically +5 volts and the latch section 202 will be in the desired state of indicating the state of the flash section 200.

Even though cell $\overline{C}$ has a very small drive capability, by controlling the supply voltage $V_{SUP}$ as described, the cell is capable of forcing latch section 202 to the desired state. Programmed cell C will not have much, if any, tendency to pull the input of inverter 205 down and thus will not oppose the action of cell $\overline{C}$. However, even if the programmed threshold voltage of cell C approached the erased threshold voltage of cell $\overline{C}$, it can be seen that the cell with the largest cell current will still be able to control the state of the latch section 202. This differential action enhances the reliability of the operation of the subject data storage unit. Note also that the outputs of inverters 205 and 209 are coupled to respective inverters 228 and 230 so that loading on the latch section outputs will be equal. The latch section will thus remain capacitively balanced so as to enhance the ability of the flash cells C and $\overline{C}$ to force the latch section to any desired state.

Verify

As previously explained, the Verify cycle is used to determine the state of the latch section 202. This operation can be used to determine the state of the flash section 200 if preceded by a Recall cycle. The Verify cycle utilizes complementary data inputs A and $\overline{A}$ and compares them with the state of latch section 202. Comparator section 201 functions essentially as an exclusive NOR circuit and provides a logic low output $\overline{V}_{ER}$ in the event there is a match between latch section 202 and the data input A and $\overline{A}$.

By way of example, assume that a Verify cycle is to take place so that verify signal $F_V$ is made active. This causes transistor 218 of comparator section 201 to be conductive. Further assume that data input A is a logic "1" (high) so that $\overline{A}$ is a logic "0" (low), and that inverter 205 output of latch section 202 is a logic "0" so that inverter 209 output is a logic "1". Since input A is high and the output of inverter 205 is low, transistor 220 of comparator 201 section is conductive and transistor 224 is off. Similarly, since input $\overline{A}$ is low and the output of inverter 209 is high, transistor 222 is off and transistor 226 is on. There is a pull-up device (not depicted) connected between the output of comparator section 201 and voltage $V_{cc}$. As a result of transistors 224 and 222 being off, there is no conductive path between the source of transistor 218 and the circuit common. Accordingly, the output $V_{ER}$ remains in a high state ("1") indicating a valid compare.

If the outputs of inverters 205 and 209 are logic "1" and "0", respectively, and the data inputs A and $\overline{A}$ remain the same, transistors 220 and 224 are both conductive. Thus, when transistor 218 is turned on by signal $F_V$, the output $V_{ER}$ will be pulled down to a logic "0" indicating a no compare condition.

In the event the data inputs A and $\overline{A}$ are a logic "0" and "1", respectively, and the outputs of inverters 205 and 209 are a logic "1" and "0", respectively, transistors 220 and 226 are off. Thus, signal $V_{ER}$ is a logic "1" thereby indicating a valid compare. Continuing, if inputs A and $\overline{A}$ were a logic "0" and "1", respectively and inverters 205 and 209 were a logic "0" and "1", respectively, transistors 222 and 226 are conductive so that signal $V_{ER}$ is a logic "0", thereby indicating a no compare.

The various operations for programming the control parameters CP in data storage units 14 are typically performed when the memory system is placed in a non-user "test" mode of operation. Circuitry for sensing when the memory system is to be placed in a test mode of operation and for placing the system in that mode is disclosed in above-cited U.S. application Ser. No. 08/386,704, filed Feb. 10, 1995.

Figure 8:
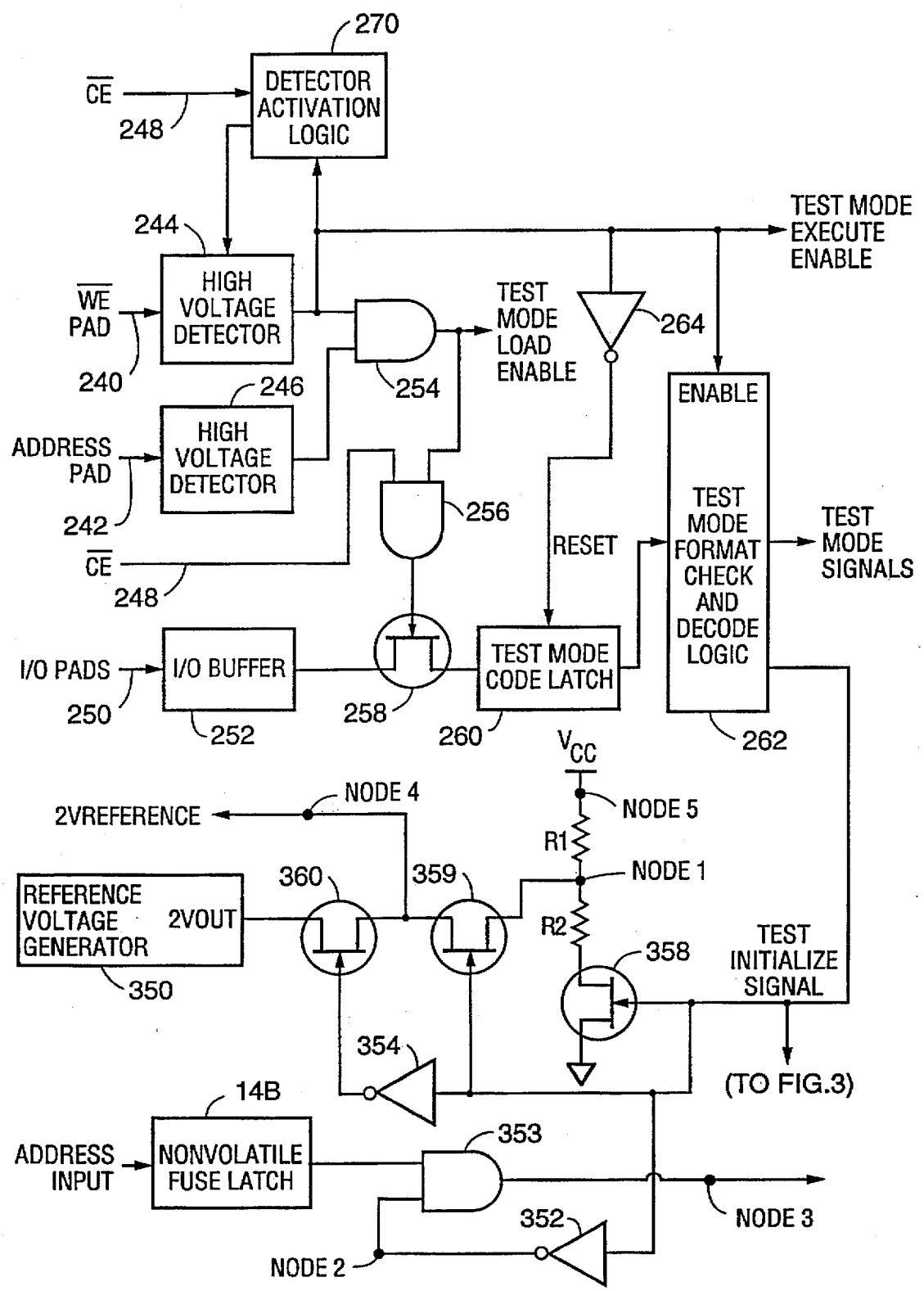
FIG. 8 is a block diagram of a circuit used for detecting when the FIG. 2 system has been placed in a test mode and for determining which test mode has been detected, which includes a preferred embodiment of the default parameter means of the invention.

FIG. 8 is an example of a circuit (included in circuit 29 of chip 103 of FIG. 2, except for elements 14B, 352, and 353 thereof which are included in circuit 17A of chip 103 as shown in FIG. 4) for entering and executing test mode operations, and for implementing a preferred embodiment of the present invention. Among other signals, test mode commands must be applied to the data I/O terminals of chip 103 to indicate which one of various test modes is to be entered. Typically, the end user of the memory system would have no reason to cause the memory system to enter the test mode since this mode is intended to be used by the memory fabrication facility. Furthermore, accidental entry into the test mode is to be avoided since the memory could be rendered permanently inoperable in this mode. Thus, the test mode circuitry is designed to specifically reduce the likelihood of accidental entry into the test mode by requiring simultaneous application of high voltages to multiple memory system terminals.

The FIG. 8 circuit is activated by application of a high voltage to two or more terminals 240 and 242 of the memory system from an external source. These terminals are non-dedicated terminals used during normal memory operations. Terminals 240 and 242 may be, for example, address terminal (pad) A10 and write enable terminal $\overline{WE}$. The magnitude of the high voltage applied to terminals 240 and 242 is chosen to be outside the range of voltages which would typically be applied to those terminals during use of the terminals in normal (non-test mode) operation of the memory system. This is done to prevent an end user from unintentionally entering the test mode. The high voltage applied to terminals 240 and 242 is detected by detectors 244 and 246. A suitable detector circuit is disclosed in U.S. application Ser. No. 08/493,162, filed Jun. 21, 1995 and entitled INTEGRATED CIRCUIT HAVING HIGH VOLTAGE DETECTION CIRCUIT, the contents of which are hereby fully incorporated into the present application by reference.

After application of high voltage to terminals 240 and 242, a signal on another terminal 248, in this case the chip enable $\overline{CE}$ terminal, is made active (low). Test code data corresponding to one of several possible test modes is placed on the data I/O terminals 250 of the memory system and forwarded to I/O buffer 252 (which corresponds to one or more of buffers 122, 122A, and 122B of FIG. 2).

AND gate 254 outputs a test mode load enable signal (having a high value) when the outputs of both high voltage detectors 244 and 246 indicate a high voltage is being applied to terminals 240 and 242. The test mode load enable signal is coupled to one input of AND gate 256 together with signal $\overline{CE}$. When signal $\overline{CE}$ is brought to a high level, AND gate 256 turns on pass transistor 258, allowing transistor 258 to pass test code data from buffer 252 to test mode code latch 260. Separate I/O terminals and pass transistors 258 are used for each bit of input test mode data so that multiple bits of test mode data are loaded into latch 260 in parallel. Typically there are a total of eight bits of test code data and latch 260 contains eight bits. Signal $\overline{CE}$ is then brought back to a low level thereby switching off transistor 258 and latching the test code data in latch 260.

After latch 260 has been loaded with the test code data, one of high input voltages (such as the input to address A10 terminal 242) is removed so that the output of detector 246 goes low thereby causing AND gate 254 to cease asserting the test mode load enable signal. The output of second high voltage detector 244 will still be high, functioning as a Test Mode Enable signal. Among other functions, this high value of the Test Mode Enable signal enables Test Mode and Format Check and Decode Logic unit 262, which then verifies that the data in latch 260 corresponds to one of various defined test modes, and decodes the test mode code (determined by the test code data in latch 260) to determine which one of approximately fifteen different memory test modes has been entered. In each of these test modes, Test Mode and Format Check and Decode Logic unit 262 produces an associated test mode signal which is used by chip 103 in combination with other signals for carrying out the various functions of the selected test mode.

Chip 103 remains in the selected test mode as long as the voltage applied to terminal 240 remains high. Even if signal $\overline{CE}$ changes state, detector activation logic 270 keeps detection circuits 244 and 246 enabled as long as the voltage applied to terminal 240 remains high. During the course of carrying out the various test modes operations, it is necessary periodically to change the state of chip enable $\overline{CE}$ signal. However, since address A10 on line 242 has been shifted to a low state, the low output of AND gate 256 prevents any change in the contents of test mode code latch 260.

Once test mode operation is completed, the high voltage applied to terminal 240 is removed thereby causing the Test Mode Enable signal to go low, thereby ending test mode operation. When the voltage at terminal 240 goes low, the output of inverter 264 (provided as a reset signal to latch 260) goes high thereby resetting latch 260.

The test mode codes loaded into latch 260 are preferably of a specific format to reduce the possibility of accidental entry into a test mode. The test mode code is typically divided into two groups of bits, with a first group of bits ("format" bits) signifying a test mode operation and the remaining bits signifying a particular one of the test modes. For example, there may be three different test modes in which the system uses control parameter data stored in the data storage units 14 (e.g., units 14A and 14B) or default parameter data replacing such stored control parameter data, any of which can be selected by appropriate test mode code data in latch 260. In at least one of these test modes, operation of state machine 120 (FIG. 2) is controlled in response to control parameter data stored in data storage units 14 (or default parameter data replacing such stored control parameter data). Details of control of the operation of state machine 120 are described in above-cited U.S. application Ser. No. 08/508,921 (filed Jul. 28, 1995).

The FIG. 8 circuit includes default parameter circuitry (comprising elements 262, 352, 353, 354, 358, 359, 360, R1, and R2) for asserting during at least one test mode (e.g., a test mode denoted herein as a "test initialize mode"): a default value of a control parameter (for determining top or bottom addressing) regardless of the control parameter bit stored in data storage unit 14B; and a default voltage level ($V_{int}$) at Node 4 (rather than a reference voltage, $V_{ref}$, determined by reference voltage generator 350).

In response to a distinctive test mode code (determined by the test code data in latch 260), unit 262 asserts test mode signals (including the "Test Initialize" signal indicated in FIG. 8) which are used by chip 103 in combination with other signals for carrying out the various functions of a selected test mode. The Test Initialize signal is asserted to the gates of pass transistors 358 and 359, through inverter 352 to one input of AND gate 353, and through inverter 354 to the gate of pass transistor 360.

Each of pass transistors 358 and 359 is "on" when Test Initialize is high (during the test initialize mode). In this state, each of transistors 358 and 359 passes voltage levels between its source and drain. Each of pass transistors 358 and 359 is "off" when Test Initialize is low (typically, the "low" value of Test Initialize is ground potential). Similarly, transistor 360 is "on" when Test Initialize is low (so transistor 360 passes voltage levels between its source and drain), and transistor 360 is "off" when Test Initialize is high.

Resistors R1 and R2 are connected in series between Node 5 (held at supply voltage $V_{cc}$) and the drain of transistor 358. The source of transistor 358 is connected to ground (memory common).

When Test Initialize is high, current flows from Node 5 through resistors R1 and R2, and elements R1, R2, and 358 function as a resistive divider which maintains Node 1 (between resistors R1 and R2) at a voltage $V_{int}$ (determined by the resistance values of resistors R1 and R2) which is less than supply voltage $V_{cc}$. Thus, during the test initialize mode (while Test Initialize is high), the FIG. 8 circuit asserts voltage $V_{int}$ at Node 4, regardless of the value of the reference voltage $V_{ref}$ at the output of reference voltage generator 350 (since transistor 360 is "off" when Test Initialize is high). The magnitude of voltage $V_{int}$ at Node 1 (and thus at Node 4) when Test Initialize is high is determined by the resistances of resistors R1 and R2.

When Test Initialize is low, transistors 358 and 359 are off, no current flows through resistor R1 or R2, and transistor 360 is on. Thus, at times other than during the test initialize mode (i.e., at times when Test Initialize is low), the FIG. 8 circuit asserts reference voltage $V_{ref}$ at Node 4. Node 4 is connected to circuitry within the FIG. 2 system for performing at least one memory operation, and the FIG. 2 system performs at least one such memory operation using the reference voltage $V_{ref}$ at Node 4. In preferred embodiments, $V_{ref}$ is substantially equal to 2 volts. The reference voltage $V_{ref}$ output from unit 350 can be "trimmed" in response to parameters supplied to unit 350 from non-volatile storage units other than unit 14B, and transistors 358–360 thus function as a switch to override these parameters (as well as the non-trimmed output of generator 350 itself) during the test initialize mode.

Inverter 352 and AND gate 353 of the FIG. 8 circuit are used for asserting a default value of a control parameter during initialization of the selected test mode. The Test Initialize signal is inverted by inverter 352 and the inverted Test Initialize signal is asserted to one input of AND gate 353. Thus, when Test Initialize is high, a low voltage level is asserted at the output of AND gate 353 (at Node 3) regardless of the voltage level asserted from the output of non-volatile data storage unit 14B to the other input of gate 353. This low voltage level is interpreted by the FIG. 2 circuit as a default value (a logical "0" bit) of a control parameter (parameter CP2, determining whether the circuit implements top or bottom addressing) otherwise determined by the data bit stored in unit 14B. When Test Initialize is low, the voltage level asserted at the output of AND gate 353 (at Node 3) is the voltage level asserted from the output of data storage unit 14B to gate 353, and the voltage level at Node 3 is interpreted by the FIG. 2 circuit as a control parameter determining whether the circuit implements top or bottom addressing.

Inverter 452 and AND gate 453 of FIG. 3 are also used for asserting a default value of a control parameter during the test initialize mode. The Test Initialize signal from unit 262 is inverted by inverter 452 and the inverted Test Initialize signal is asserted to an input of gate 453. When Test Initialize is high (during the test initialize mode), a low voltage level is asserted at the output of AND gate 453 regardless of the voltage level asserted from the output of non-volatile data storage unit 14A to the other input of gate 453. This low voltage level is interpreted by logic unit 15 of the FIG. 2 circuit as a default value (a logical "0" bit) of control parameter CP1 (for setting word length for the FIG. 2 circuit) whose value is otherwise determined by the data bit stored in unit 14A. When Test Initialize is low, the voltage level asserted at the output of AND gate 453 is the voltage level asserted from data storage unit 14A to gate 453, which is interpreted by logic unit 15 of the FIG. 2 circuit as control parameter CP1 (for setting word length).

In variations on the FIG. 8 circuitry, the Test Initialize signal is supplied to at least one logic circuit in addition to (or instead of) the circuit comprising elements 352–354 and 358–360 of FIG. 8 (or the circuit comprising elements 452 and 453 of FIG. 3), to cause each such logic circuit to assert a default value of a control parameter corresponding to another data storage unit (other than unit 14A or 14B). In preferred implementations of such variations, the outputs of all data storage units of the FIG. 2 system are replaced by default parameter values.

In other variations of the FIG. 8 circuitry, a control signal other than the Test Initialize signal is asserted by unit 262 to at least one default parameter circuit (e.g., to the circuit consisting of elements 352 and 353, and/or to another logic circuit) to cause each such default parameter circuit to assert a default value of a control parameter corresponding to a non-volatile data storage unit. An example of the latter control signal is a test mode signal that triggers execution of a cycle of a test mode, other than an initialization cycle.

In alternative embodiments, such as the embodiment to be described with reference to FIG. 9, one or more storage units of a memory system are reset by the Test Initialize signal (or another control signal) so that each storage unit (after being reset) outputs data determining a default value of a control parameter. The FIG. 9 embodiment is identical to that of FIG. 8, except in that elements 352 and 353 are omitted and the Test Initialize signal is asserted directly to non-volatile data storage unit 14B. In response to a high value of Test Initialize (i.e., during the test initialize mode), data storage unit 14B is reset, and thus a default voltage level is asserted at the output of unit 14B. This default voltage level (which can be a low voltage level) is interpreted by the FIG. 2 circuit as a default value (e.g., a logical "0" bit) of a control parameter. Thus, the FIG. 9 embodiment (as well as the FIG. 8 embodiment) permits initialization of an internal control register of a memory system, so that the system can start from a known condition when executing a selected test mode.

Figure 9:
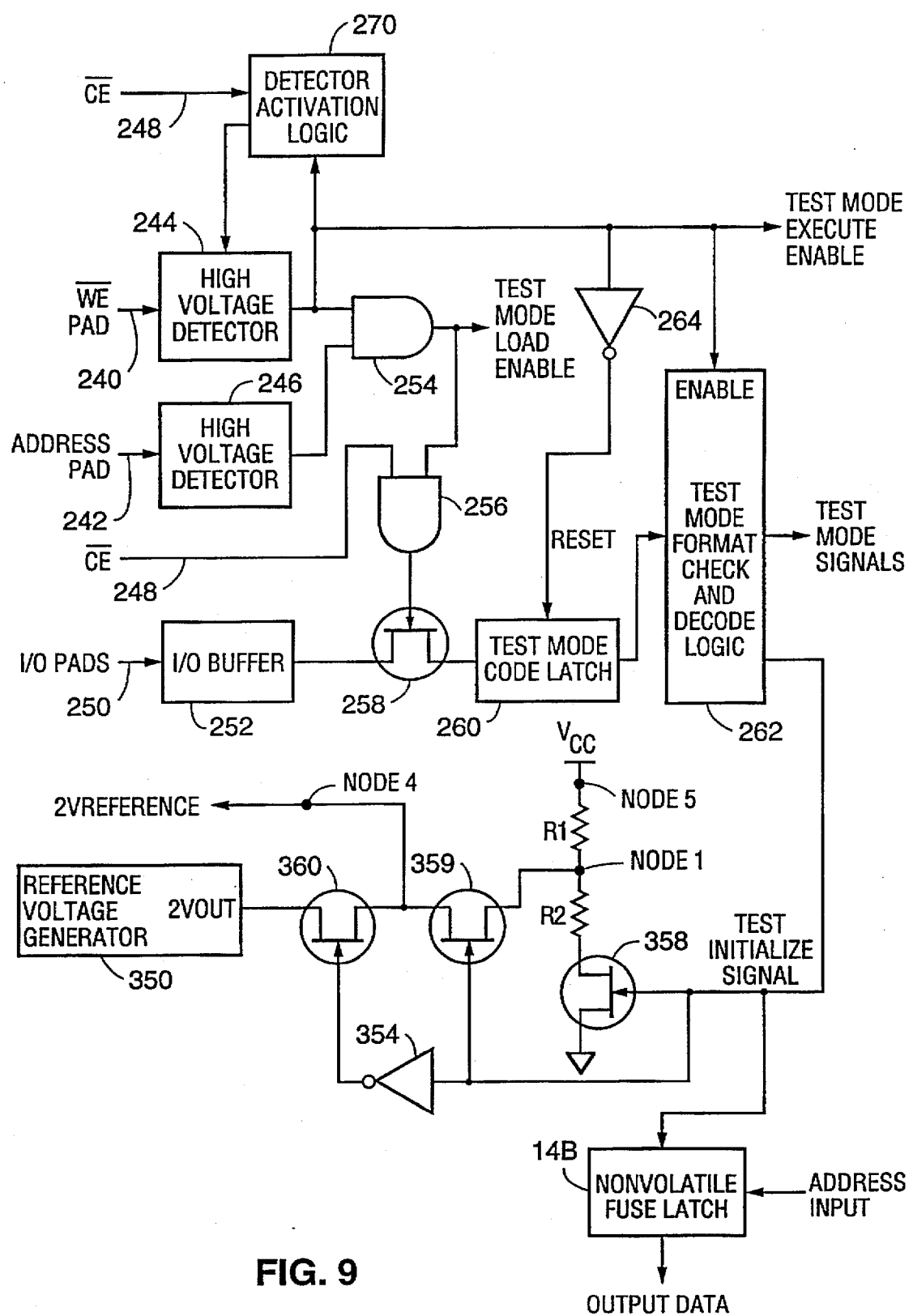
FIG. 9 is a block diagram of a variation on the FIG. 8 circuit, which includes an alternative embodiment of the default parameter means of the invention.

Inclusion of the circuitry of FIG. 8 or FIG. 9 (and/or variations thereon) in the FIG. 2 system enables the system to implement a selected test mode including the following steps:

(a) at least two pins ("high voltage pins," examples of which are terminals 240 and 242) are brought up to high voltage;

(b) on a high-going edge of a chip enable signal (e.g., $\overline{CE}$), a test mode initialize code (which can be a code sequence) is asserted (by an external processor) to other pins (e.g., terminals 250);

(c) following steps (a) and (b), the test mode initialize code is compared against stored predetermined codes, and the system enters a test mode (the "selected" test mode) determined by a predetermined code which matches the asserted test mode initialize code;

(c) at least one of the high voltage pins remains at a high voltage (at a voltage level above the normal operating voltage range) during execution of the selected test mode (where the system is programmed to discontinue the selected test mode in response to all the high voltage pins undergoing a high-to-normal voltage transition), and at least one other of the high voltage pins undergoes a high-to-normal voltage transition during the selected test mode; and (d) during at least a portion of the selected test mode, the system operates in response to default control parameter data (of the type described above), at least one default voltage level (of the type described above), or both such default control parameter data and said at least one default voltage level.

Although preferred embodiments of the inventive memory system (and method of operating a memory system) have been described in some detail, it should be understood that numerous changes from and variations on these embodiments can be made by those skilled in the art without departing from the spirit and scope of the invention as defined by the appended claims.

What is claimed is:

1. A memory system, including:

an array of memory cells;

read/write circuitry coupled to the array, operable to program selected ones of the cells in response to program control signals, and operable to read selected ones of the cells in response to read control signals;

a controller coupled to the read/write circuitry and configured to generate control signals for controlling operations of the system, said operations including programming of the cells and reading said cells, said control signals including the program control signals and the read control signals;

a data storage circuit configured to store control parameter data determining at least one control parameter for at least one of the operations; and a default parameter circuit coupled to the controller and the data storage circuit and configured to output default parameter data rather than the control parameter data in response to a first control signal from the controller, wherein the default parameter data determines a default value of the at least one control parameter.

2. The system of claim 1, wherein said memory system is an integrated circuit.

3. The system of claim 1, also including:

a reference voltage circuit coupled to the default parameter circuit and configured to assert a reference voltage for use by the system during at least one of the operations, wherein the default parameter circuit receives the reference voltage, and outputs a default voltage rather than the reference voltage, in addition to said default parameter data, in response to the first control signal.

4. The system of claim 1, wherein the system is operable in a selected one of a test mode and a normal operating mode, the controller is configured to output the first control signal with a first level during the test mode, and the default parameter circuit is configured to output the default parameter data in response to said first level of the first control signal.

5. The system of claim 1, wherein the default parameter circuit is a logic circuit coupled to receive the control parameter data from the data storage circuit and configured to output the default parameter data rather than the control parameter data in response to the first control signal.

6. The system of claim 5, wherein the logic circuit includes:

an inverter having an input coupled to receive the first control signal and an output for asserting an inverted first control signal in response to the first control signal; and an AND gate having a first input coupled to receive the inverted first control signal and a second input coupled to receive the control parameter data.

7. The system of claim 1, wherein the data storage unit is a non-volatile data storage unit.

8. A memory system, including:

an array of memory cells;

a controller configured to generate control signals for controlling operations of the system, said operations including programming the memory cells and reading the memory cells;

a reference voltage circuit coupled to at least one of the array and the controller and configured to assert a reference voltage for use by the system during at least one of the operations;

a default parameter circuit coupled to the reference voltage circuit so as to receive the reference voltage and configured to output a default voltage rather than the reference voltage in response to a first control signal from the controller.

9. The system of claim 8, wherein said memory system is an integrated circuit.

10. The system of claim 8, wherein the system is operable in a selected one of a test mode and a normal operating mode, the controller is configured to assert the first control signal with a first level during the test mode, and the default parameter circuit is configured to output the default voltage in response to said first level of the first control signal.

11. The system of claim 8, wherein the default parameter circuit includes:

a resistive divider circuit configured to assert a default voltage at a first node; and a switch connected between the first node, the reference voltage circuit, and an output, and configured to assert the default voltage at the output in response to a first level of the first control signal and to assert the reference voltage to the output in response to a second level of the first control signal.

12. A method for operating a memory system in a test mode, said system including a data storage unit and a memory and being capable of operating in a normal operating mode under control of signals including a parameter signal indicative of control parameter data stored in the data storage unit, said method including the steps of:

(a) asserting a test mode code to the system;

(b) entering the test mode in response to the test mode code; and (c) during at least a portion of the test mode, asserting a default signal indicative of default control parameter data to the memory and operating said memory under control of the default signal rather than under control of said parameter signal.

13. The method of claim 12, wherein the system includes a first set of pins and a second set of pins, said first set including at least a first pin and a second pin, said method also including the step of:

not later than during step (a), asserting a high voltage to each of the pins in the first set, and wherein step (b) includes the steps of comparing the test mode code against predetermined codes, and entering the test mode in response to a match between the test mode code and one of the predetermined codes, and wherein the first pin remains at the high voltage during the test mode and the second pin undergoes a transition during the test mode from the high voltage to a normal voltage, wherein said normal voltage is lower than said high voltage.

14. The method of claim 12, wherein a reference voltage is asserted at a first node in said normal operating mode, and also including the step of:

(d) during at least a portion of the test mode, asserting a default voltage at the first node rather than said reference voltage.

* * * * *